(12) United States Patent
Chiu et al.

(10) Patent No.: US 12,336,244 B2
(45) Date of Patent: Jun. 17, 2025

(54) METAL CAPS FOR GATE STRUCTURES

(71) Applicant: Taiwan Semiconductor Manufacturing Company, Ltd., Hsinchu (TW)

(72) Inventors: Shih-Hang Chiu, Taichung (TW); Chung-Chiang Wu, Taichung (TW); Wei-Cheng Wang, Hsinchu (TW); Chia-Wei Chen, Hsinchu (TW); Jian-Hao Chen, Hsinchu (TW); Kuan-Ting Liu, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 475 days.

(21) Appl. No.: 17/834,255

(22) Filed: Jun. 7, 2022

(65) Prior Publication Data

US 2023/0010065 A1  Jan. 12, 2023

Related U.S. Application Data

(60) Provisional application No. 63/219,948, filed on Jul. 9, 2021.

(51) Int. Cl.
*H01L 21/28* (2025.01)
*H10D 62/10* (2025.01)
(Continued)

(52) U.S. Cl.
CPC ..... *H10D 62/343* (2025.01); *H01L 21/28194* (2013.01); *H10D 62/118* (2025.01); *H10D 62/393* (2025.01); *H10D 64/018* (2025.01)

(58) Field of Classification Search
CPC ........... H01L 29/1066; H01L 21/28194; H01L 29/0665; H01L 29/1095; H01L 29/66553;
(Continued)

(56) References Cited

U.S. PATENT DOCUMENTS 7,888,195 B2 * 2/2011 Lin ................. H01L 21/823807
438/188
9,287,181 B2 * 3/2016 Tseng ................ H01L 21/28185
(Continued)

FOREIGN PATENT DOCUMENTS

TW     202005091 A    1/2020

*Primary Examiner* — Vu A Vu
(74) *Attorney, Agent, or Firm* — HAYNES AND BOONE, LLP

(57) ABSTRACT

A semiconductor structure and a method of forming the same are provided. In an embodiment, an exemplary semiconductor structure includes a gate structure. The gate structure includes a gate dielectric layer, an n-type work function layer embedded in the gate dielectric layer, a dielectric capping layer embedded in the n-type work function layer, and a p-type work function layer embedded in the dielectric capping layer. A top surface of the gate structure exposes the n-type work function layer, the dielectric capping layer, and the p-type work function layer. The semiconductor structure also includes a first metal cap on the n-type work function layer and a second metal cap on the p-type work function layer. The first metal cap is spaced apart from the second metal cap. without formed on the dielectric capping layer.

20 Claims, 22 Drawing Sheets

(51) Int. Cl.
*H10D 62/17* (2025.01)
*H10D 64/01* (2025.01)

(58) Field of Classification Search
CPC ........... H01L 29/0673; H01L 29/42376; H01L 29/42392; H01L 29/4966; H01L 29/66439; H01L 29/6653; H01L 29/165; H01L 29/7848; H01L 29/66545; H01L 29/775; H01L 29/78696; B82Y 10/00
USPC ........................................................... 257/211
See application file for complete search history.

(56) References Cited

U.S. PATENT DOCUMENTS

| | | | | |
|---|---|---|---|---|
| 9,318,335 | B2* | 4/2016 | Kim | H01L 21/823842 |
| 9,337,107 | B2* | 5/2016 | Zhao | H01L 27/092 |
| 9,553,092 | B2* | 1/2017 | Bao | H01L 21/32139 |
| 9,824,929 | B2* | 11/2017 | Jangjian | H01L 21/82345 |
| 10,049,940 | B1* | 8/2018 | Chen | H01L 23/53266 |
| 10,269,659 | B2* | 4/2019 | Li | H01L 21/823814 |
| 10,276,452 | B1* | 4/2019 | Seshadri | H01L 21/28185 |
| 2018/0190546 | A1* | 7/2018 | Wu | H01L 21/823842 |
| 2019/0139828 | A1* | 5/2019 | Cheng | H01L 27/088 |
| 2019/0140105 | A1* | 5/2019 | Tsai | H01L 29/78618 |
| 2019/0385855 | A1* | 12/2019 | Chien | H01L 29/66795 |

* cited by examiner

METAL CAPS FOR GATE STRUCTURES

PRIORITY DATA

The present application claims the benefit of U.S. Provisional Application No. 63/219,948, entitled "Semiconductor Structures and Methods of Fabrication Thereof," filed Jul. 9, 2021, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the sizes of the transistor components continue to get smaller, gate resistance may increase undesirably. The increase in gate resistance may adversely impact device performance such as a speed. Therefore, although existing semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
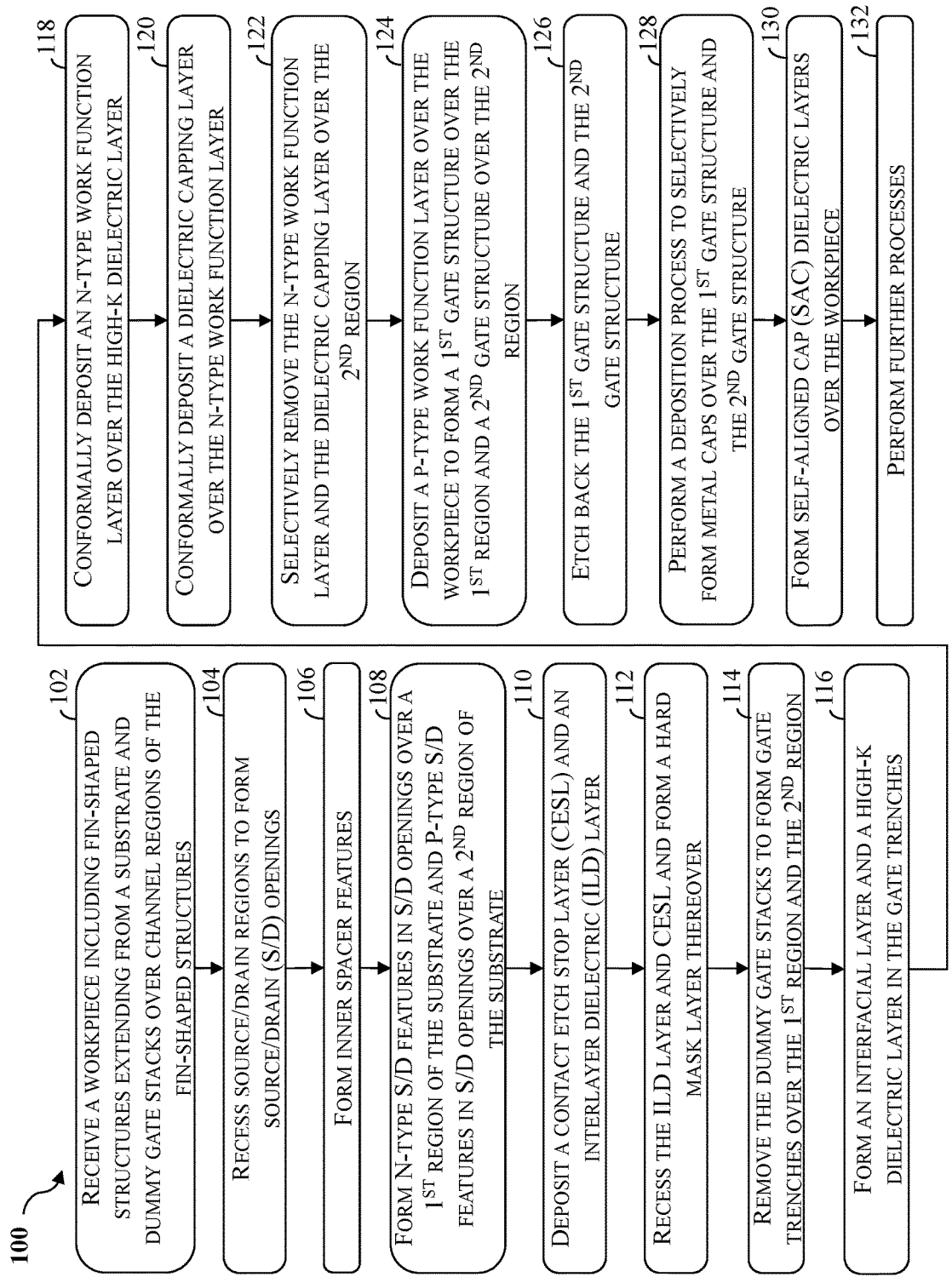
FIG. 1 is a flowchart illustrating a method of forming a semiconductor structure, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Multi-gate devices are introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. As the scaling down continues, dimensions of gate structures scale down and gate pitch shrinks, which adversely increase the gate resistance.

The present disclosure is directed to methods of forming semiconductor structures with a reduced gate resistance. In some embodiments, an exemplary method includes depositing an n-type work function layer over a gate dielectric layer, forming a dielectric capping layer over the n-type work function layer to prevent the n-type work function from being oxidized, forming a p-type work function layer over the dielectric capping layer, and selectively forming a first metal cap directly on the p-type work function layer and a second metal cap directly on the n-type work function layer without forming the metal cap on the gate dielectric layer or the dielectric capping layer. The first and second metal caps may reduce the gate resistance. The first and second metal caps may be examined by transmission electron microscope (TEM) or energy-dispersive X-ray spectroscopy (EDS).

The various aspects of the present disclosure will now be described in more detail with reference to the figures. In that regard, FIG. 1 is a flowchart illustrating a method 100 forming a semiconductor structure according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of methods. Not all steps are described herein in detail for reasons of simplicity. Method 100 is described below in conjunction with FIGS. 2-22, which are fragmentary cross-sectional views of a workpiece 200 at different stages of fabrication according to embodiments of the method 100 in FIG. 1. For avoidance of doubts, the X, Y and Z directions in FIGS. 2-22 are perpendicular to one another and are used consistently throughout FIGS. 2-22. Because the workpiece 200 will be fabricated into a semiconductor structure, the workpiece 200 may be referred to herein as a semiconductor structure 200 as the context requires. Throughout the present disclosure, like reference numerals denote like features unless otherwise expressly excepted.

Figure 2:
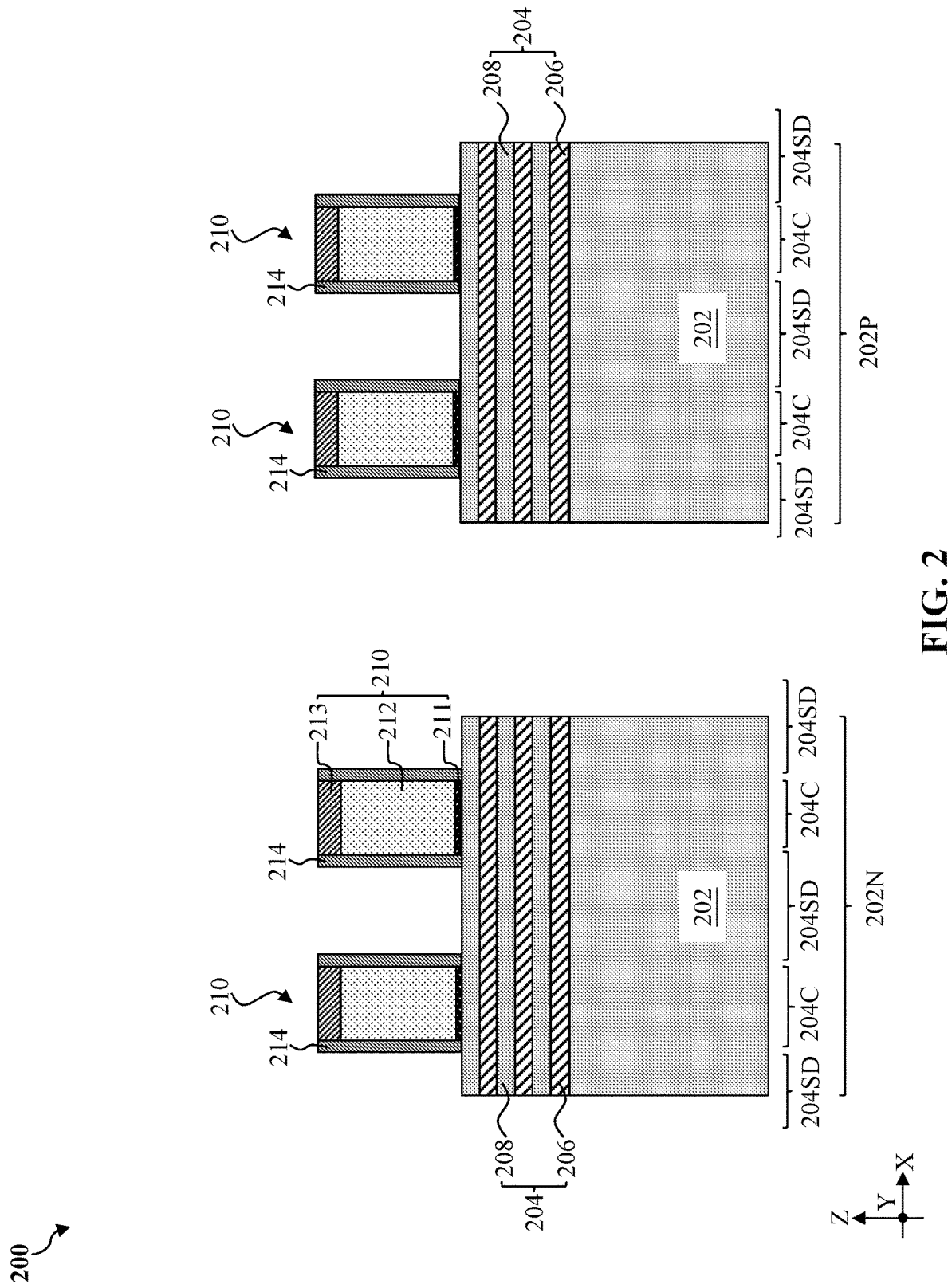
FIGS. 2-22 illustrate fragmentary cross-sectional views of the workpiece at various stages of fabrication in accordance with the method in FIG. 1, according to various aspects of present disclosure.
Figure 20:
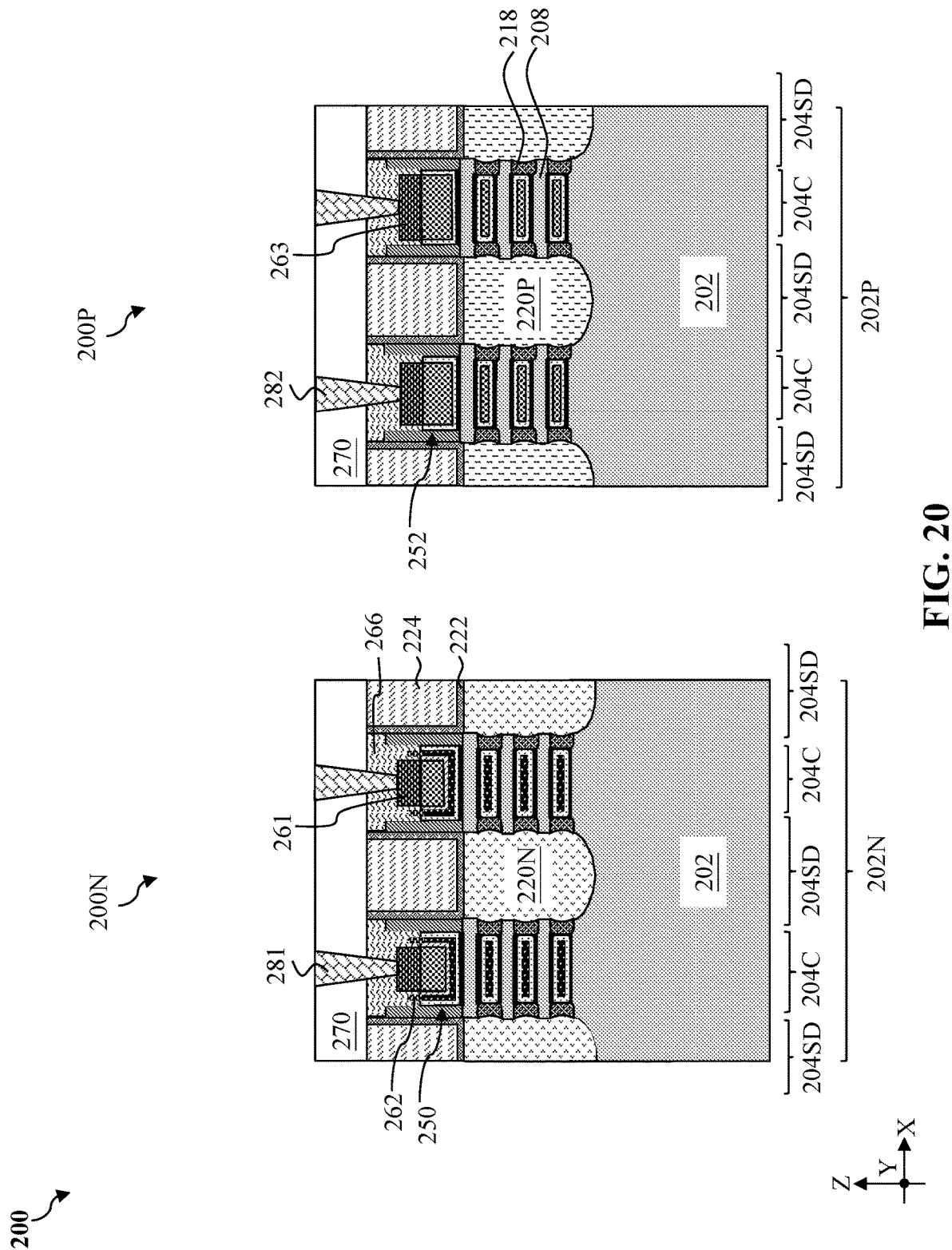

Referring now to FIGS. 1 and 2, method 100 includes a block 102 where a workpiece 200 is received. The workpiece 200 includes a substrate 202. In an embodiment, the substrate 202 is a bulk silicon substrate (i.e., including bulk single-crystalline silicon). The substrate 202 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator (SGOI) substrate, or a germanium-on-insulator (GeOI) substrate, and includes a carrier, an insulator on the carrier, and a semiconductor layer on the insulator. The substrate 202 can include various doped regions configured according to design requirements of semiconductor structure 200. P-type doped regions may include p-type dopants, such as boron (B), boron difluoride ($BF_2$), other p-type dopant, or combinations thereof. N-type doped regions may include n-type dopants, such as phosphorus (P), arsenic (As), other n-type dopant, or combinations thereof. The various doped regions can be formed directly on and/or in substrate 202, for example, providing a p-well structure, an n-well structure, or combinations thereof. An ion implantation process, a diffusion process, and/or other suitable doping process can be performed to form the various doped regions. Referring to FIG. 2, the substrate 202 includes a first region 202N for formation of n-type MBC transistors 200N (e.g., as shown in FIG. 20) and a second region 202P for formation of p-type MBC transistors 200P (e.g., as shown in FIG. 20). The first region 202N may include a p-type well and the second region 202P may include an n-type well.

Still referring to FIG. 2, the workpiece 200 includes a vertical stack 204 of alternating semiconductor layers disposed over the first region 202N and the second region 202P. In an embodiment, the vertical stack 204 includes a number of channel layers 208 interleaved by a number of sacrificial layers 206. Each channel layer 208 may include a semiconductor material such as, silicon, germanium, silicon carbide, silicon germanium, GeSn, SiGeSn, SiGeCSn, other suitable semiconductor materials, or combinations thereof, while each sacrificial layer 206 has a composition different from that of the channel layer 208. In an embodiment, the channel layer 208 includes silicon (Si), the sacrificial layer 206 includes silicon germanium (SiGe). The vertical stack 204 and a portion of the substrate 202 is then patterned to form a first fin-shaped structure (not labeled) over the first region 202N and a second fin-shaped structure (not labeled) over the second region 202P. While not explicitly shown in FIG. 2, in some implementations, dielectric isolation features 205 (shown in FIG. 18) may be formed to isolate two adjacent fin-shaped structures. The dielectric isolation features 205 may also be referred to as shallow trench isolation (STI) features. The dielectric isolation features 205 may include silicon oxide, silicon oxynitride, fluorine-doped silicate glass (FSG), a low-k dielectric, combinations thereof, and/or other suitable materials.

Still referring to FIG. 2, the workpiece 200 also includes a number of dummy gate stacks 210 over channel regions 204C of the first fin-shaped structure and the second fin-shaped structure. The channel regions 204C and the dummy gate stacks 210 also define source/drain regions 204SD that are not vertically overlapped by the dummy gate stacks 210. Source/drain region(s) may refer to a source region or a drain region, individually or collectively dependent upon the context. Each of the channel regions 204C is disposed between two source/drain regions 204SD along the X direction. In this embodiment, a gate replacement process (or gate-last process) is adopted where some of the dummy gate stacks 210 serve as placeholders for gate structures 250 and 252 (shown in FIG. 15). Other processes for forming the gate structures 250 and 252 are possible. The dummy gate stack 210 includes a dummy gate dielectric layer 211, a dummy gate electrode layer 212 over the dummy gate dielectric layer 211, and a gate-top hard mask layer 213 over the dummy gate electrode layer 212. The dummy gate dielectric layer 211 may include silicon oxide. The dummy gate electrode layer 212 may include polysilicon. The gate-top hard mask layer 213 may include silicon oxide, silicon nitride, other suitable materials, or a combination thereof. Gate spacers 214 extend along sidewalls of the dummy gate stacks 210. In some embodiments, the gate spacers 214 may include silicon oxycarbide, silicon carbonitride, silicon nitride, zirconium oxide, aluminum oxide, or a suitable dielectric material. In an embodiment, the gate spacers 214 include silicon nitride, silicon carbonitride, silicon oxycarbonitride (SiOCN), and a dielectric constant of the gate spacers 214 is greater than a dielectric constant of silicon oxide ($SiO_2$).

Figure 3:
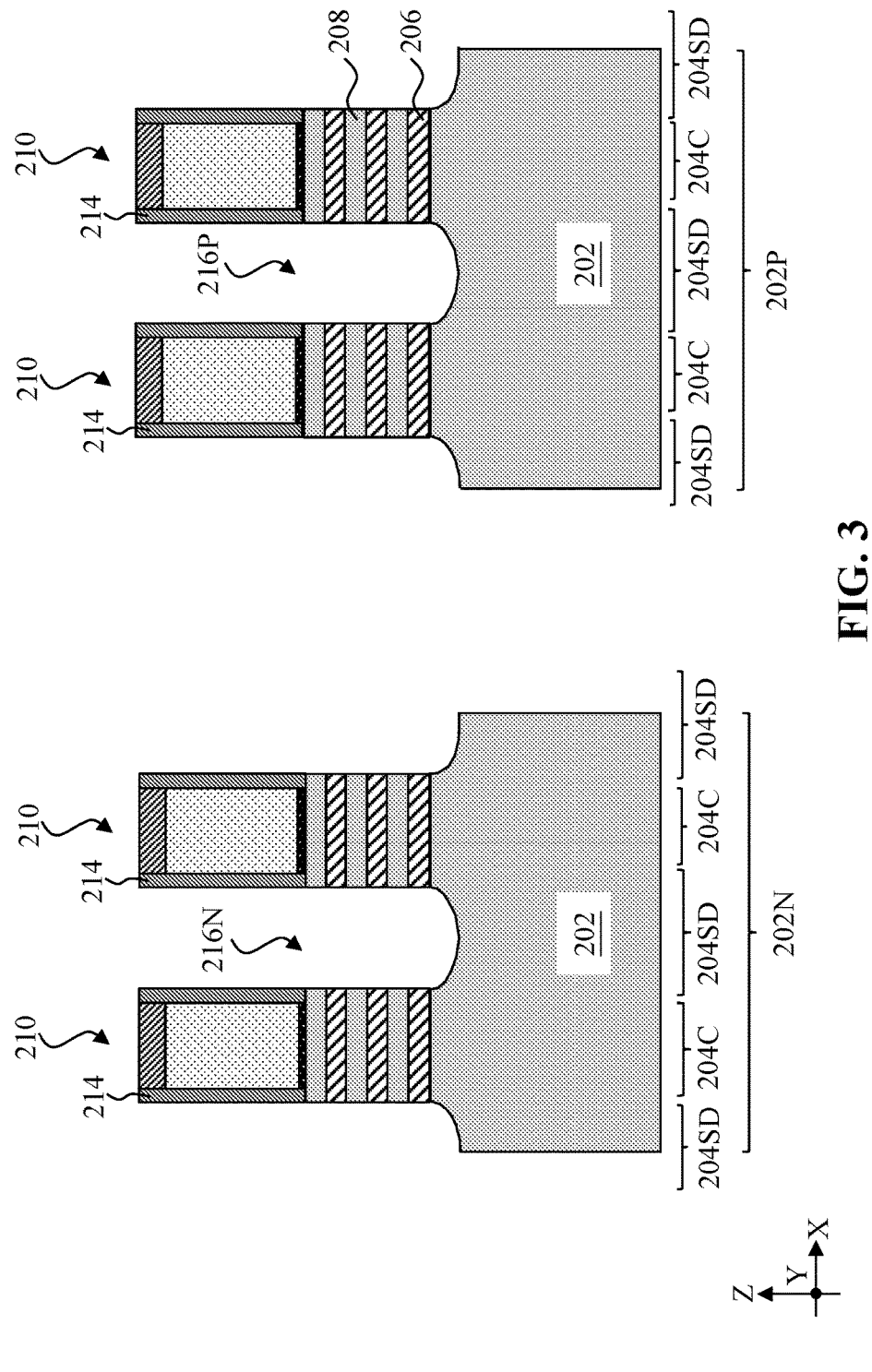

Referring now to FIGS. 1 and 3, method 100 includes a block 104 where source/drain regions 204SD of the first fin-shaped structure and the second fin-shaped structure are selectively recessed to form source/drain openings 216N over the first region 202N and source/drain openings 216P over the second region 202P. In some embodiments, the source/drain regions 204SD of the fin-shaped structures that are not covered by the dummy gate stacks 210 or the gate spacer 214 are anisotropically etched by a dry etch or other suitable etching process to form the source/drain openings 216N and 216P. As illustrated in FIG. 3, sidewalls of the channel layers 208 and the sacrificial layers 206 are exposed in the source/drain openings 216N and 216P.

Figure 4:
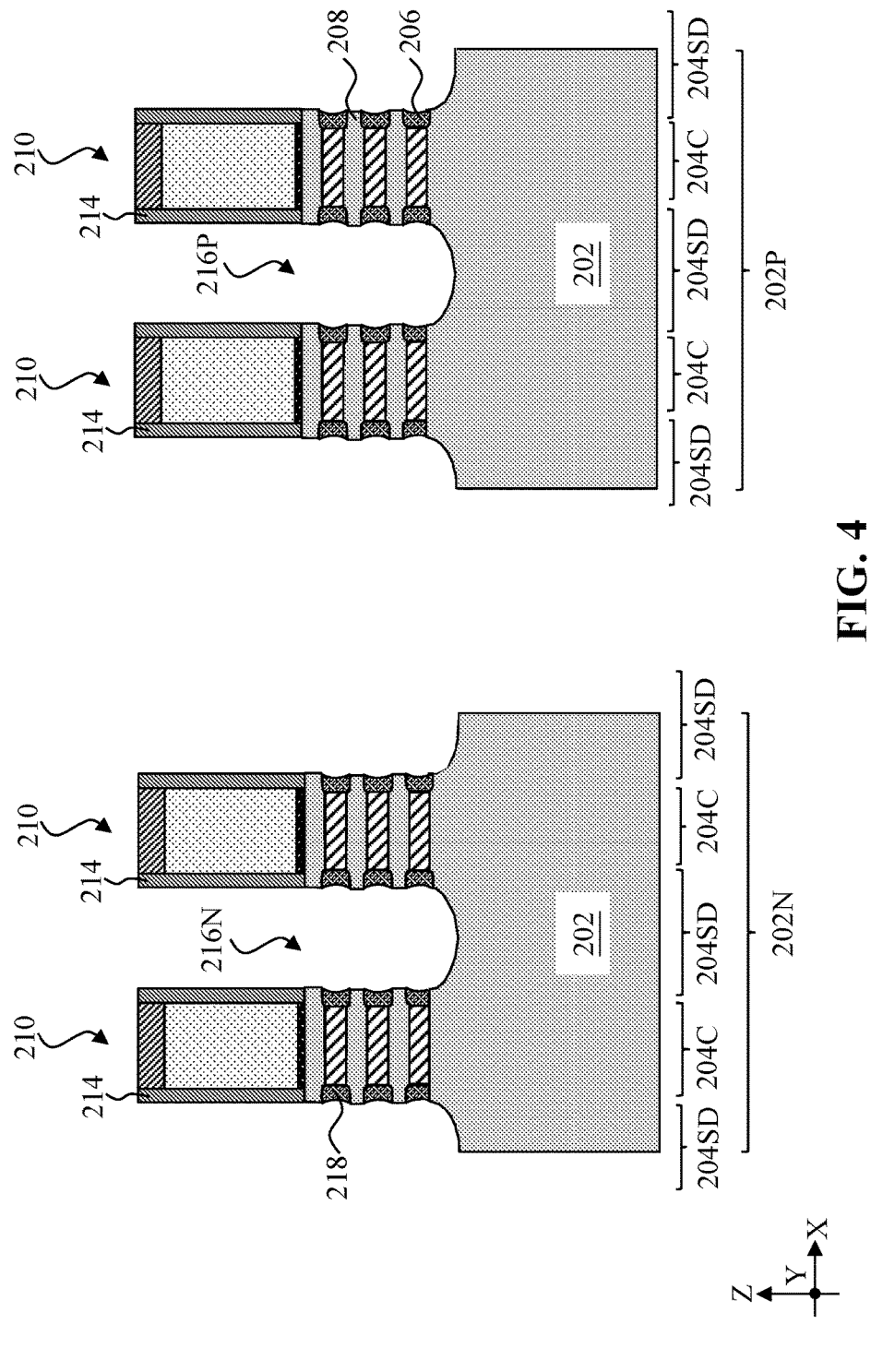

Referring now to FIGS. 1 and 4, method 100 includes a block 106 where inner spacer features 218 are formed. After forming the source/drain openings 216N and 216P, the sacrificial layers 206 are selectively and partially recessed to form inner spacer recesses, while the exposed channel layers 208 are not significantly etched. Inner spacer features 218 are then formed in the inner spacer recesses. The inner spacer features 218 may include silicon oxide, silicon nitride, silicon oxycarbide, silicon oxycarbonitride, silicon carbonitride, metal nitride, or other suitable dielectric materials.

Figure 5:
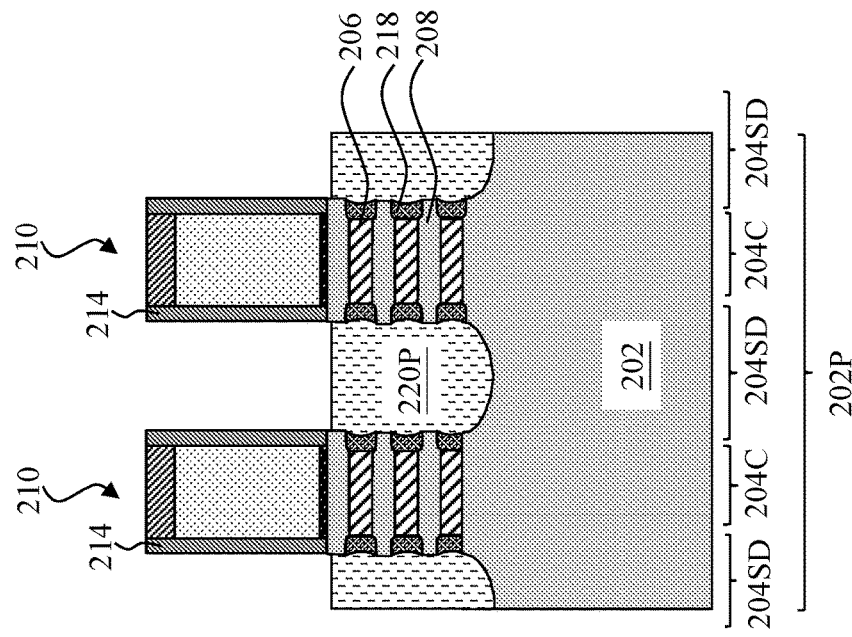
Figure 5:
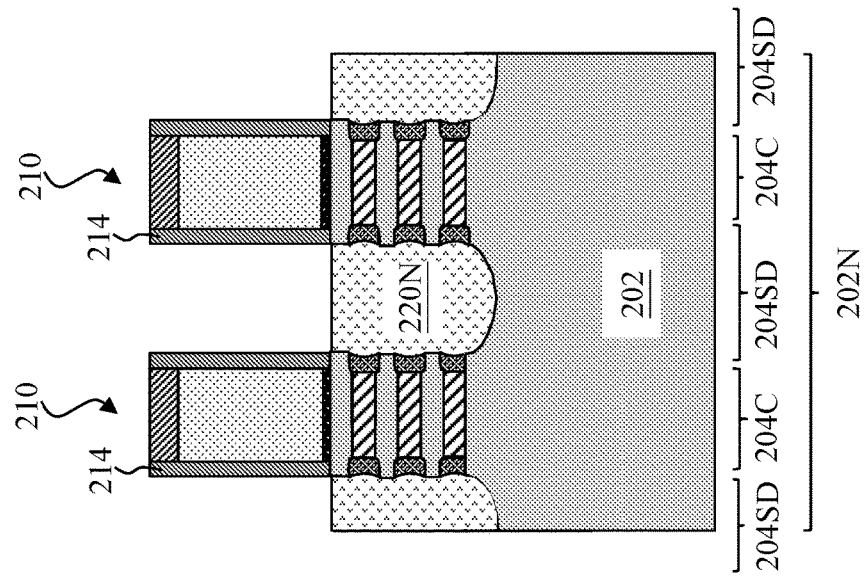

Referring now to FIGS. 1 and 5, method 100 includes a block 108 where n-type source/drain features 220N are formed in source/drain openings 216N and p-type source/drain features 220P are formed in source/drain openings 216P. Source/drain feature(s) may refer to a source or a drain, individually or collectively dependent upon the context. The n-type source/drain features 220N and the p-type source/drain features 220P each may be epitaxially and selectively formed from exposed top surfaces of the substrate 202 and exposed sidewalls of the channel layers 208 by using an epitaxial process, such as vapor phase epitaxy (VPE), ultrahigh vacuum chemical vapor deposition (UHV-CVD), molecular-beam epitaxy (MBE), and/or other suitable processes. The n-type source/drain features 220N are coupled to the channel layers 208 in the channel regions 204C over the first region 202N and may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. The p-type source/drain features 220P are coupled to the channel layers 208 in the channel regions 204C over the second region 202P and may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process.

Figure 6:
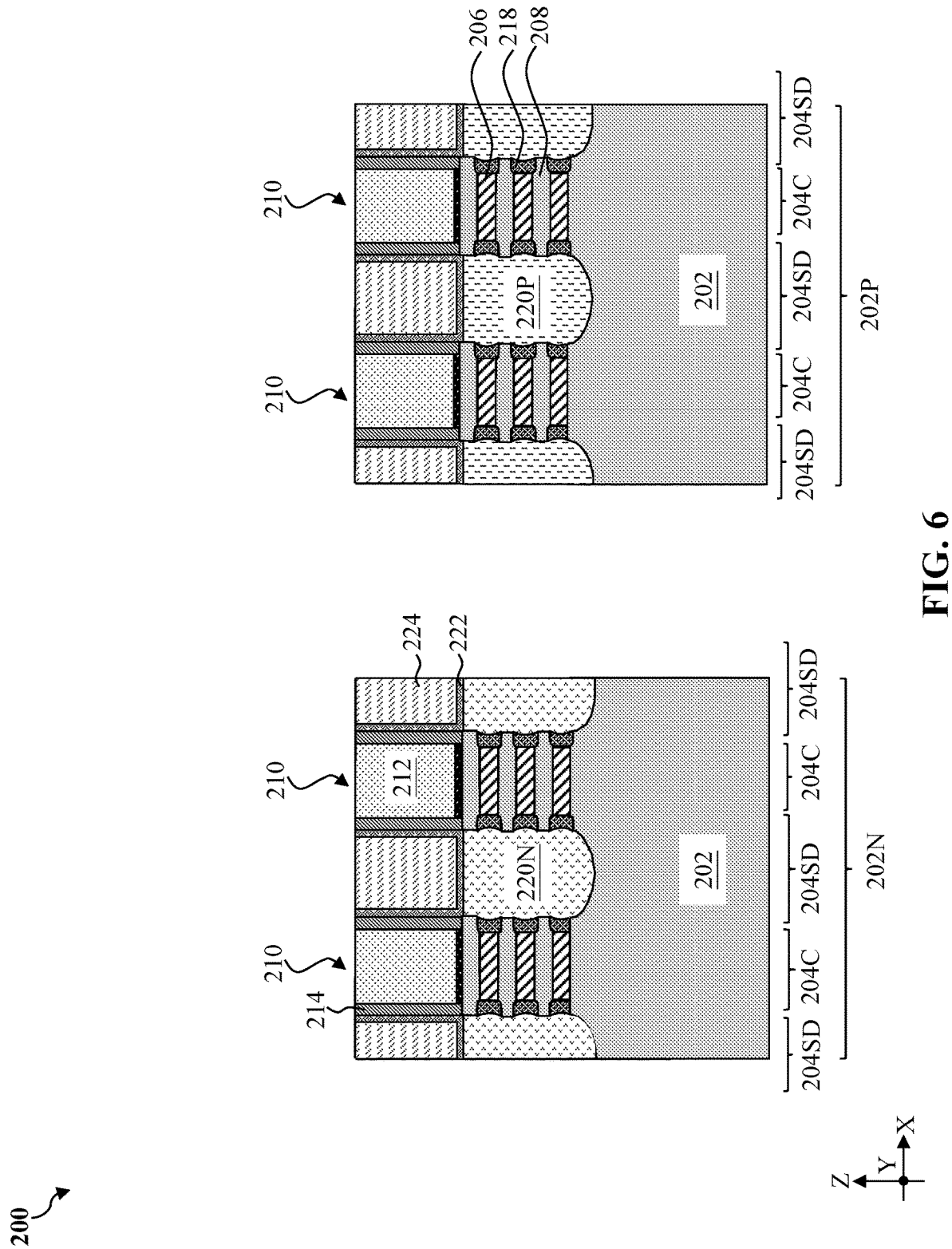

Referring now to FIGS. 1 and 6, method 100 includes a block 110 where a contact etch stop layer (CESL) 222 and an interlayer dielectric (ILD) layer 224 are deposited over the workpiece 200. The CESL 222 may include silicon nitride, silicon oxynitride, and/or other suitable materials and may be formed by atomic layer deposition (ALD) process, plasma-enhanced chemical vapor deposition (PECVD) process and/or other suitable deposition or oxidation processes. The ILD layer 224 is deposited by a flowable CVD (FCVD), a CVD process, a physical vapor deposition (PVD) process, or other suitable deposition technique over the workpiece 200 after the deposition of the CESL 222. The ILD layer 224 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. After depositing the CESL 222 and the ILD layer 224, a planarization process (e.g., chemical mechanical polishing CMP) is performed to remove excess materials (including the gate-top hard mask layer 213) to expose the dummy gate electrode layer 212 of the dummy gate stacks 210.

Figure 7:
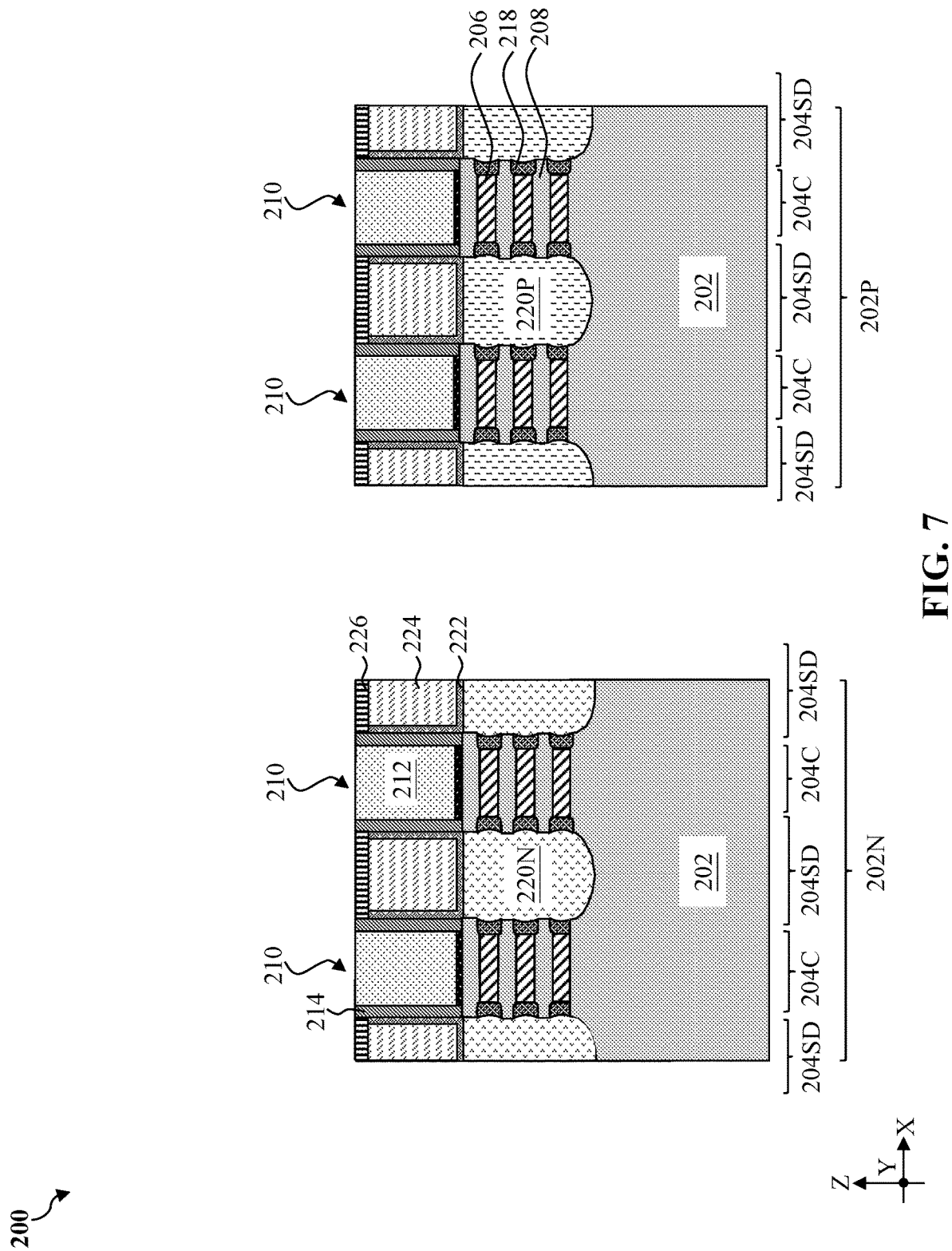

Referring now to FIGS. 1 and 7, method 100 includes a block 112 where the CESL 222 and ILD layer 224 are partially recessed and a hard mask layer 226 is formed over the recessed CESL 222 and the recessed ILD layer 224. A suitable etching process (e.g., a dry anisotropic etching process) may be implemented to selectively remove top portions of the CESL 222 and ILD layer 224 without substantially removing the dummy gate electrode layer 212 or the gate spacers 214. The hard mask layer 226 is then deposited over the recessed CESL 222 and the recessed ILD layer 224 and between the dummy gate stacks 210. The hard mask layer 226 may include aluminum oxide, silicon nitride, silicon carbonitride, silicon oxycarbide, silicon oxynitride, silicon oxycarbonitride, other suitable materials, or combinations thereof, and may be formed by CVD, ALD, PVD, other suitable methods, or combinations thereof. In an embodiment, both the hard mask layer 226 and the gate spacer 214 include silicon oxycarbonitride (SiOCN), and the nitrogen concentration in the hard mask layer 226 is substantially equal to the nitrogen concentration in the gate spacer 214.

Figure 8:
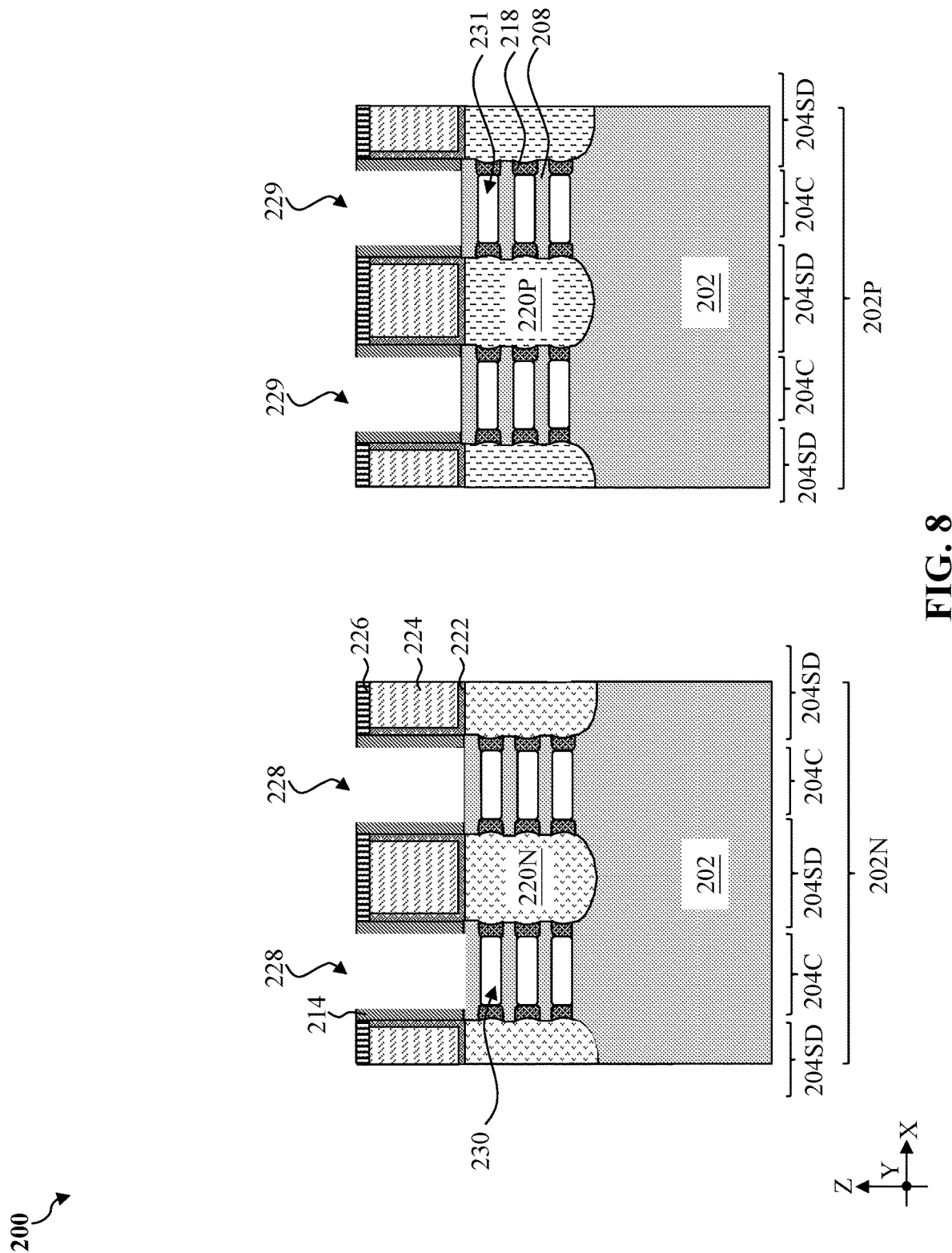

Referring now to FIGS. 1 and 8, method 100 includes a block 114 where the dummy gate stacks 210 are selectively removed to form a gate trench 228 over the first region 202N and a gate trench 229 over the second region 202P. An etching process may be implemented to selectively remove the dummy gate electrode layer 212 and the dummy gate dielectric layer 211 without substantially removing the gate spacers 214 or the hard mask layer 226. The etching process may be a dry etching process, a wet etching process, or combinations thereof that implements a suitable etchant. After the removal of the dummy gate stacks 210, the sacrificial layers 206 in the channel regions 204C are selectively removed to release the channel layers 208 as channel members 208. The selective removal of the sacrificial layers 206 forms openings 230 under the gate trench 228 and openings 231 under the gate trench 229. The sacrificial layers 206 may be removed using selective dry etching process or selective wet etching process. The selective dry etching process may include use of one or more fluorine-based etchants, such as fluorine gas or hydrofluorocarbons. The selective wet etching process may include an APM etch (e.g., ammonia hydroxide-hydrogen peroxide-water mixture).

Figure 9:
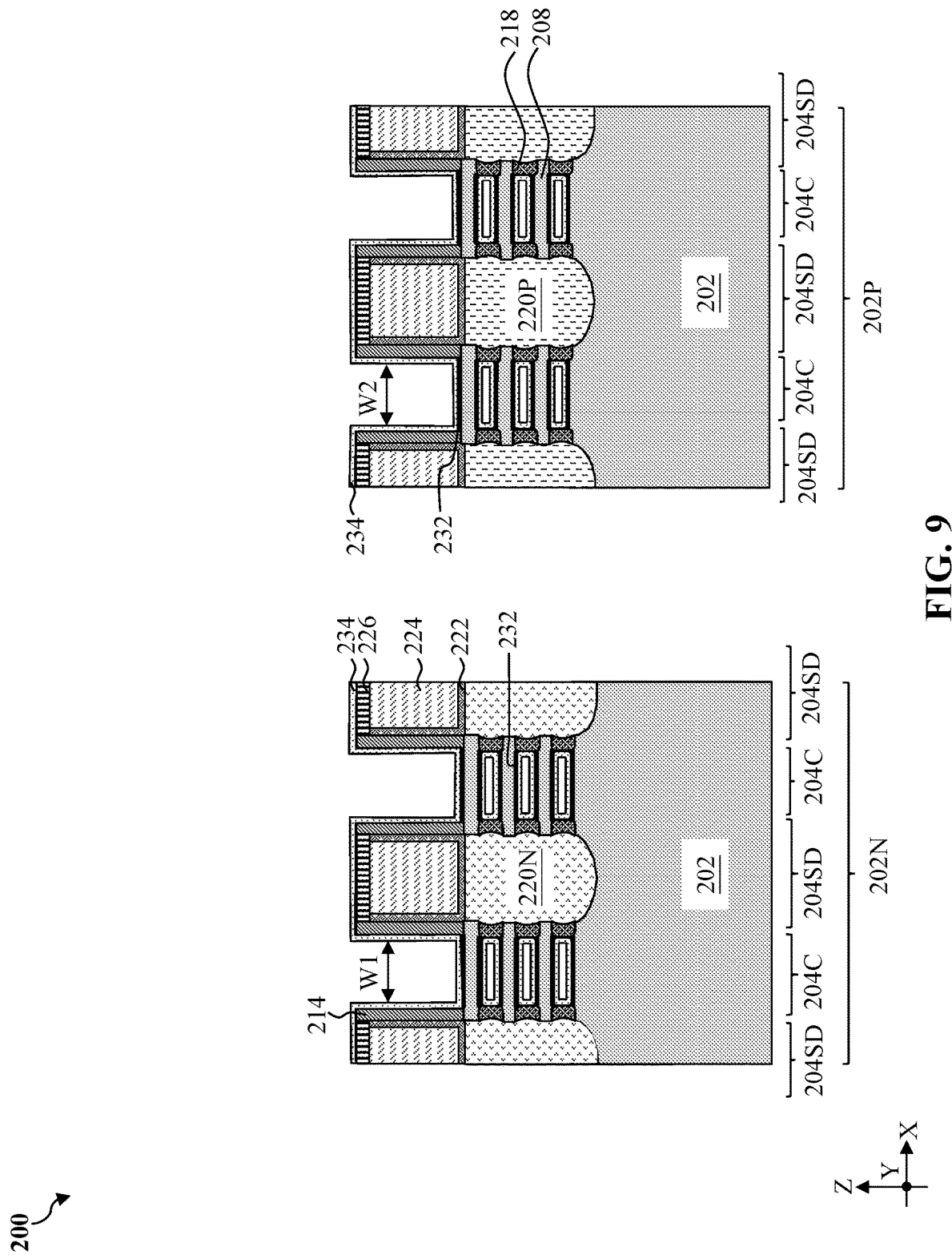

Referring now to FIGS. 1 and 9, method 100 includes a block 116 where an interfacial layer 232 is formed to wrap around and over each of the channel members 208 over the first region 202N and the second region 202P. In some embodiments, the interfacial layer 232 may include silicon oxide or other suitable material. In some embodiments, the interfacial layer 232 may be formed using a suitable method, such as atomic layer deposition (ALD), chemical vapor deposition (CVD), thermal oxidation, or other suitable method. In an embodiment, the interfacial layer 232 is formed by thermal oxidation and is thus only formed on surfaces of the channel members 208 and the substrate 202. That is, the interfacial layer 232 does not extend along sidewall surfaces of the gate spacers 214. The interfacial layer 232 partially fills the gate trenches 228-229 and openings 230-231.

Still referring to FIG. 9, after forming the interfacial layer 232, a gate dielectric layer 234 is formed over the workpiece 200 to wrap around and over each of the channel members 208. In an embodiment, the gate dielectric layer 234 is deposited conformally over the workpiece 200, including over top surfaces and sidewalls of the gate spacers 214, top surfaces of the hard mask layer 226 and interfacial layer 232. The term "conformally" may be used herein for ease of description of a layer having a substantially uniform thickness over various regions. In some embodiments, the gate dielectric layer 234 is high-k dielectric layer as its dielectric constant is greater than that of silicon dioxide (~3.9). In some implementations, the gate dielectric layer 234 may include titanium oxide ($TiO_2$), tantalum oxide ($Ta_2O_5$), hafnium silicon oxide ($HfSiO_4$), zirconium oxide ($ZrO_2$), zirconium silicon oxide ($ZrSiO_2$), aluminum oxide ($Al_2O_3$), zirconium oxide (ZrO), yttrium oxide ($Y_2O_3$), $SrTiO_3$ (STO), $BaTiO_3$ (BTO), BaZrO, aluminum silicon oxide (AlSiO), hafnium tantalum oxide (HfTaO), hafnium titanium oxide (HMO), $(Ba,Sr)TiO_3$ (BST), silicon nitride (SiN), silicon oxynitride (SiON), combinations thereof, or other suitable material. After forming the gate dielectric layer 234, along the X direction, the gate trench 228 has a width W1 and the gate trench 229 has a width. To fulfill different functions, W1 may be same to or different from W2. In the present embodiment, W1 is equal to or greater than W2. That is, W1≥W2.

Figure 10:
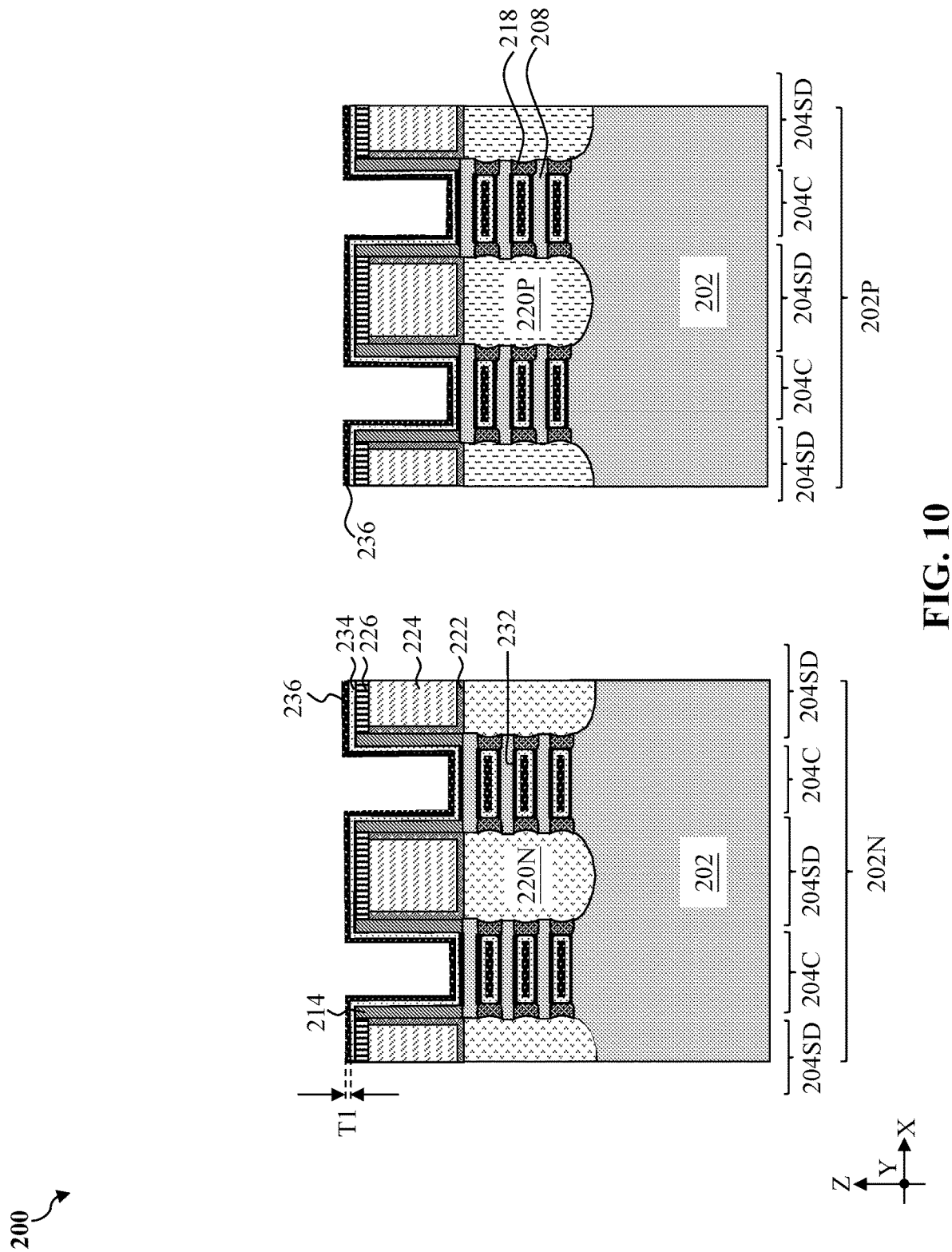

Referring to FIGS. 1 and 10, method 100 includes a block 118 where an n-type work function layer 236 is deposited on the gate dielectric layer 234 to wrap around and over each of the channel members 208 over the first region 202N and the second region 202P. It is noted that the n-type work function layer 236 may merge between adjacent channel members 208 over the first region 202N, preventing subsequent layers from entering the openings 230 between adjacent channel members 208. The n-type work function layer 236 may include titanium-aluminum based metal. In one embodiment, the n-type work function layer 236 includes titanium aluminum carbon (TiAlC). In another embodiment, the n-type work function layer 236 includes titanium aluminum (TiAl). The n-type work function layer 236 may be deposited using atomic layer deposition (ALD) or other suitable deposition processes. In some instances, the n-type work function layer 236 may be deposited to have a uniform thickness T1 over the workpiece. T1 may be between about 2 nm and about 5 nm. In an embodiment, a ratio of the thickness T1 to the width W1 may be between about 0.04 and about 0.3 such that a satisfactory gate structure may be formed for the n-type MBC transistor 200N.

Figure 11:
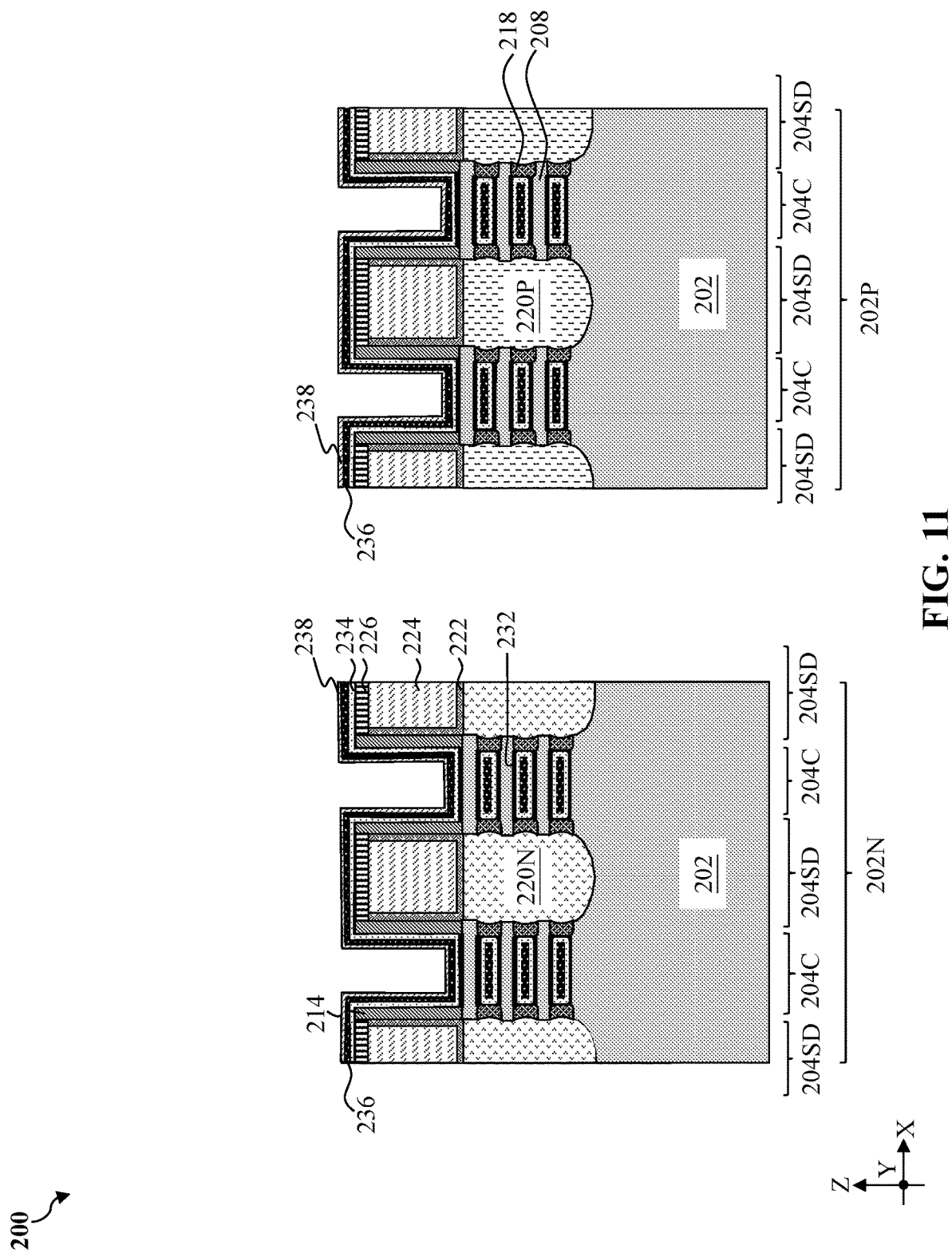

Referring to FIGS. 1 and 11, method 100 includes a block 120 where a dielectric capping layer 238 is deposited over the n-type work function layer 236. The dielectric capping layer 238 is formed directly over the n-type work function layer 236 to protect the n-type work function layer 236 from being oxidized to form an oxide layer (e.g., aluminum oxide ($Al_2O_3$)) in subsequent processes (e.g., BARC removal process), leading to a stable threshold voltage. In an embodiment, the dielectric capping layer 238 includes silicon oxide. In some embodiments, the dielectric capping layer 238 may be a multi-layer structure that includes a first layer on the n-type work function layer 236 and a second layer on the first layer. The first layer may include titanium and silicon (e.g., titanium silicide), the second layer may include silicon and oxygen (e.g., silicon oxide). Forming the dielectric capping layer 238 may advantageously reduce the oxidation of the n-type work function layer 236 and may thus reduce the corresponding gate resistance of the resulting gate structures. It is noted that, the dielectric capping layer 238 is disposed along sidewalls of the gate trench 228 and gate trench 229 but does not extend into the openings 230 and 231 as openings 230 and 230 have been substantially filled.

Figure 12:
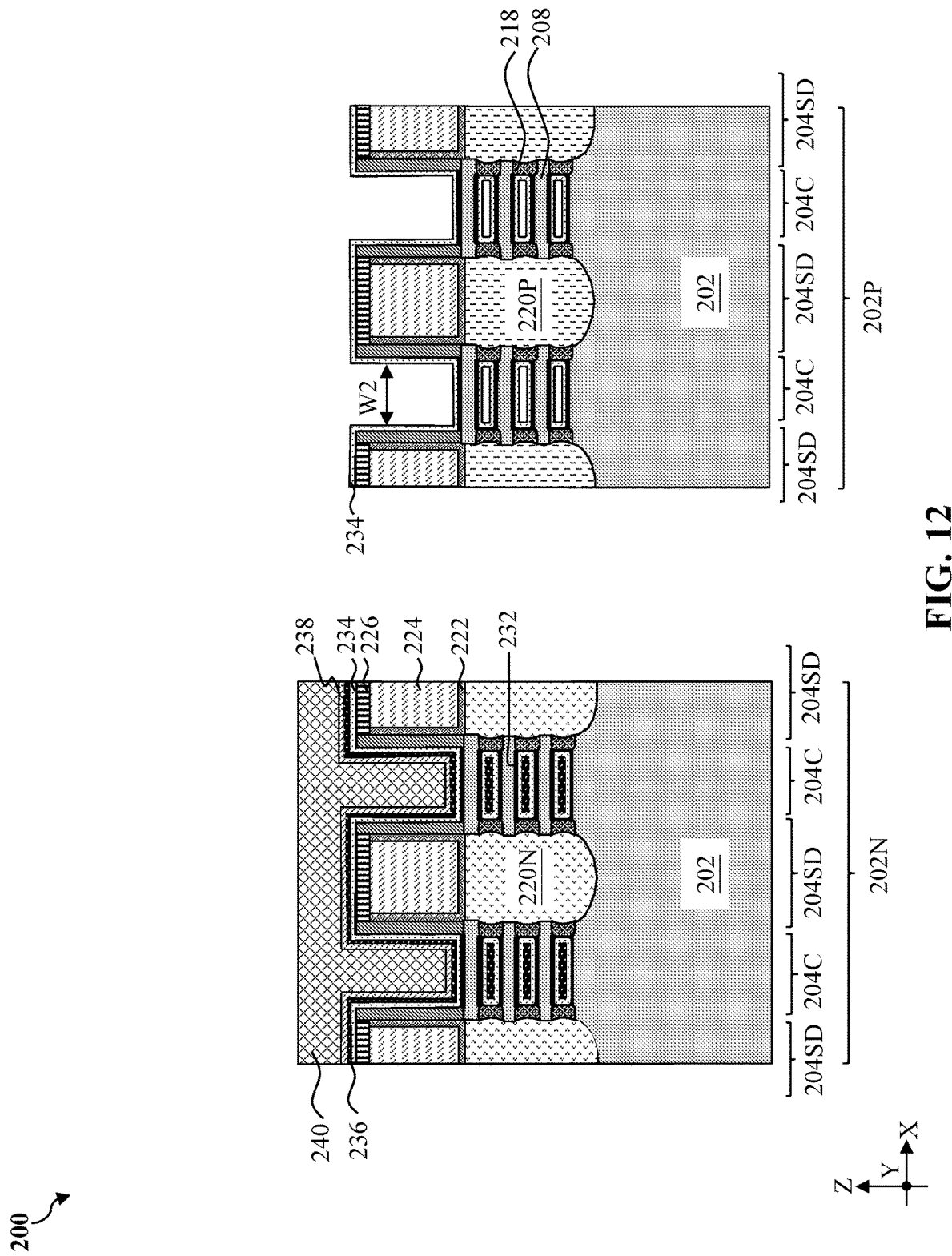
Figure 13:
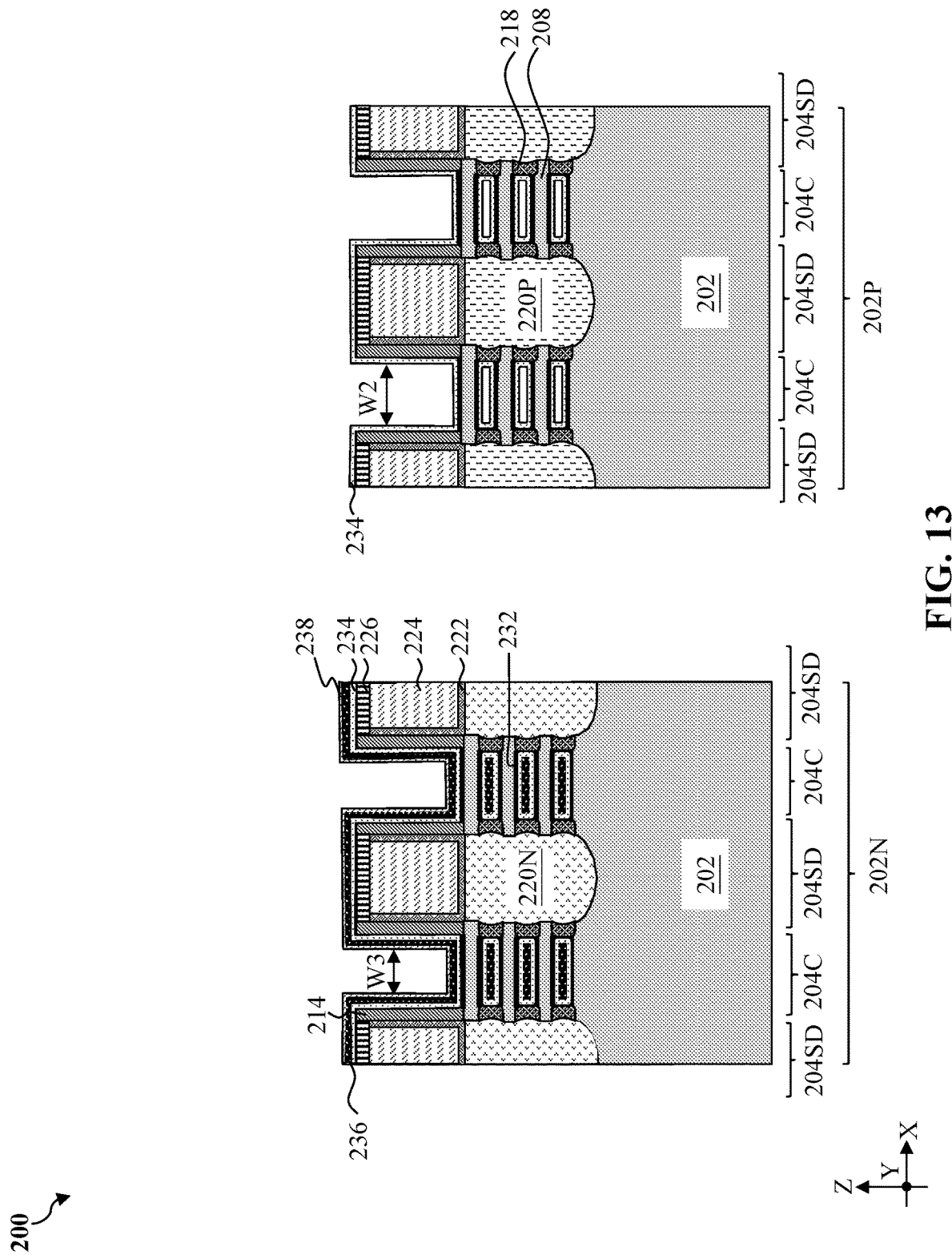

Referring to FIG. 1 and FIGS. 12-13, method 100 includes a block 122 where portions of the n-type work function layer 236 and the dielectric capping layer 238 formed over the second region 202P are selectively removed. In embodiments represented in FIG. 12, a mask film 240 (e.g., a bottom anti-reflective coating (BARC) layer) is formed over the workpiece 200 using spin-on coating, flowable CVD (FCVD), or other suitable processes. The mask film 240 is then patterned to cover a portion of the dielectric capping layer 238 formed over the first region 202N while exposing a portion of the dielectric capping layer 238 formed over the second region 202P, as shown in FIG. 12. The patterning process may include a lithography process (e.g., photolithography or e-beam lithography) which may include photoresist coating, soft baking, mask aligning, exposure, post-exposure baking, photoresist developing, rinsing, drying, other suitable lithography techniques, and/or combinations thereof. The photoresist may be removed after the patterning. With the patterned mask film 240 covering the dielectric capping layer 238 over the first region 202N, portions of the n-type work function layer 236 and the dielectric capping layer 238 formed over the second region 202P are selectively removed by a selective wet etching process or a selective dry etching process without substantially etching the gate dielectric layer 234. Exemplary wet etching processes may include phosphoric acid ($H_3PO_4$), nitric acid ($HNO_3$), acetic acid ($CH_3COOH$), hydrofluoric acid (HF), or a combination thereof. Exemplary dry etching processes may include fluorine-containing gas (e.g., $CF_4$), a chlorine-containing gas (e.g., $Cl_2$, $BCl_3$), other suitable gases and/or plasmas, and/or combinations thereof.

Referring to FIG. 13, after the selective removal of the n-type work function layer 236 and the dielectric capping layer 238 formed over the second region 202P, the patterned mask film 240 (e.g., the BARC layer) may be selectively removed by any suitable method, such as a dry etching process (e.g., $N_2$, $H_2$, and/or $O_2$) or a wet cleaning process utilizing a suitable etchant. In some embodiments, the BARC removal process may also remove a portion of the dielectric capping layer 238 over the n-type work function layer 236 that is formed over the first region 202N. After the BARC removal, the gate trench 228 has a width W3 and the gate trench 229 has the width W2. Due to the formation of the n-type work function layer 236 and the dielectric capping layer 238 in the gate trench 228, W3 is smaller than W2. It can be seen that the dielectric capping layer 238 protects the n-type work function layer 236 from being oxidized when the patterned mask film 240 is removed.

Figure 14:
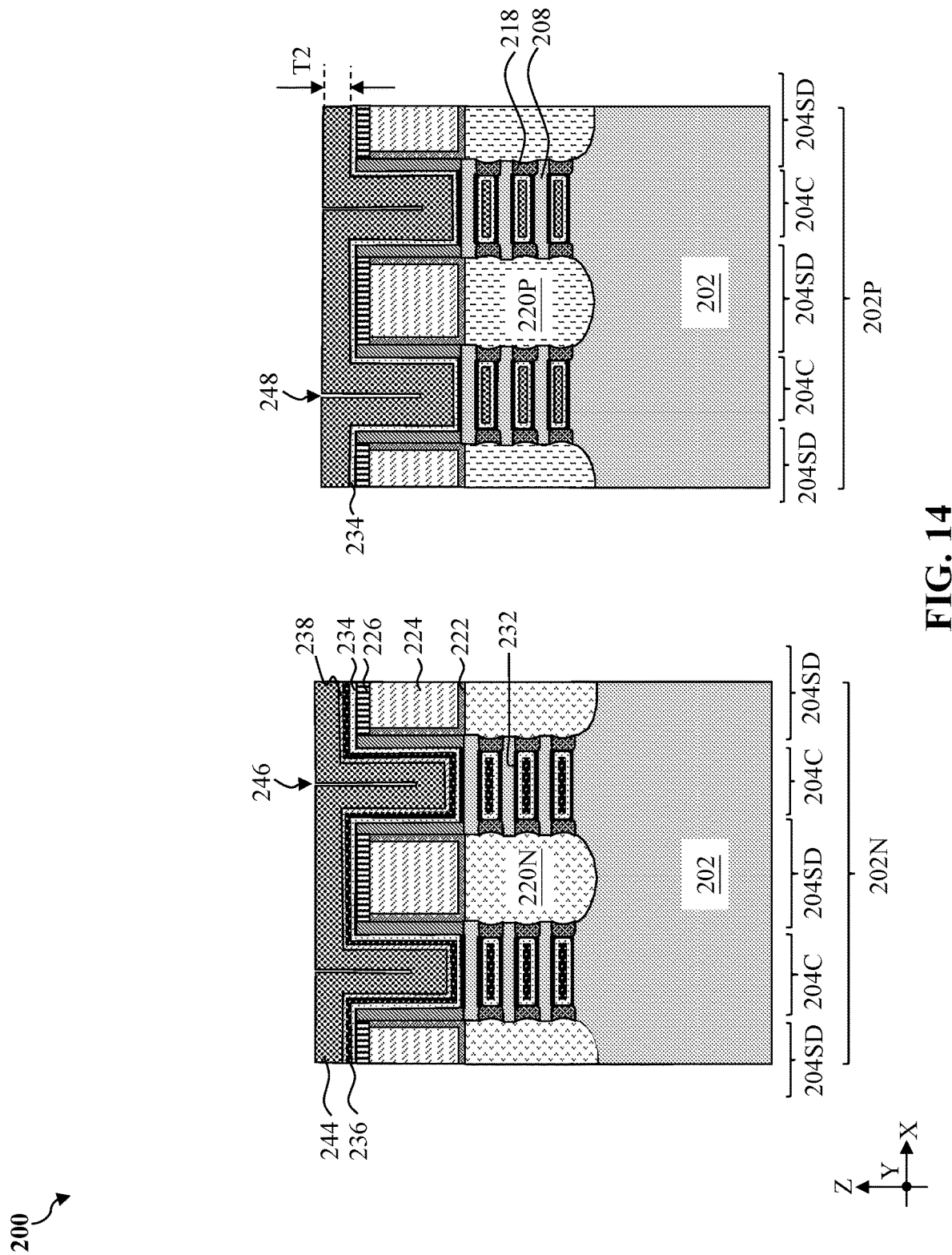

Referring to FIGS. 1 and 14, method 100 includes a block 124 where a p-type work function layer 244 is formed over the workpiece 200. In some embodiments, the p-type work function layer 244 may be deposited to have a uniform thickness T2 over the workpiece 200. In an embodiment, a ratio of the thickness T2 to the width W2 (shown in FIG. 13) may be between about 0.1 and about 0.4 such that a satisfactory gate structure 250 may be formed over the first region 202N, facilitating a to-be-selectively-formed metal cap (e.g., metal cap 261 and metal cap 263 shown in FIG. 17) on the p-type work function layer 244 and thus facilitating a satisfactory gate contact via landing on the metal cap. In an embodiment, T2 may be between about 2 nm and about 10 nm such that the device may be incorporated to existing fabrication processes. The p-type work function layer 244 may be deposited using atomic layer deposition (ALD) or other suitable processes. In some instances, the p-type work function layer 244 may include titanium (Ti), tantalum (Ta), tungsten (W), molybdenum (Mo), zirconium (Zr), vanadium (V), niobium (Nb), nitrogen (N), carbon (C), ruthenium (Ru), platinum (Pt), or nickel (Ni). For example, the p-type work function layer 244 may include titanium nitride (TiN), tungsten carbonitride (WCN), tantalum nitride (TaN), or molybdenum nitride (MoN).

As shown in FIG. 14, the p-type work function layer 244 is in direct contact with the dielectric capping layer 238 in the first region 202N and is in direct contact with the gate dielectric layer 234 in the second region 202P. The p-type work function layer 244 is also formed in the openings 231 (shown in FIG. 8) to wrap around the channel members 208 over the second region 202P. In embodiments represented in FIG. 14, the p-type work function layer 244 has a seam 246 over the first region 202N and a seam 248 over the second region 202P. The seam 246 and the seam 248 each includes an opening at a top surface of the p-type work function layer 244. In an embodiment, the seam 248 spans a width (along the X direction) that is substantially equal to a width of the seam 246. In some embodiments, after the deposition of the p-type work function layer 244, a planarization process (e.g., CMP) may be performed such that the workpiece 200 has a planar top surface. The interfacial layer 232, the gate dielectric layer 234, the n-type work function layer 236, the dielectric capping layer 238, and the p-type work function layer 244 formed in the gate trench 228 may be collectively referred to as a first gate structure 250, and the combination of the interfacial layer 232, the gate dielectric layer 234, and the p-type work function layer 244 formed in the gate trench 229 may be collectively referred to as a second gate structure 252.

Figure 15:
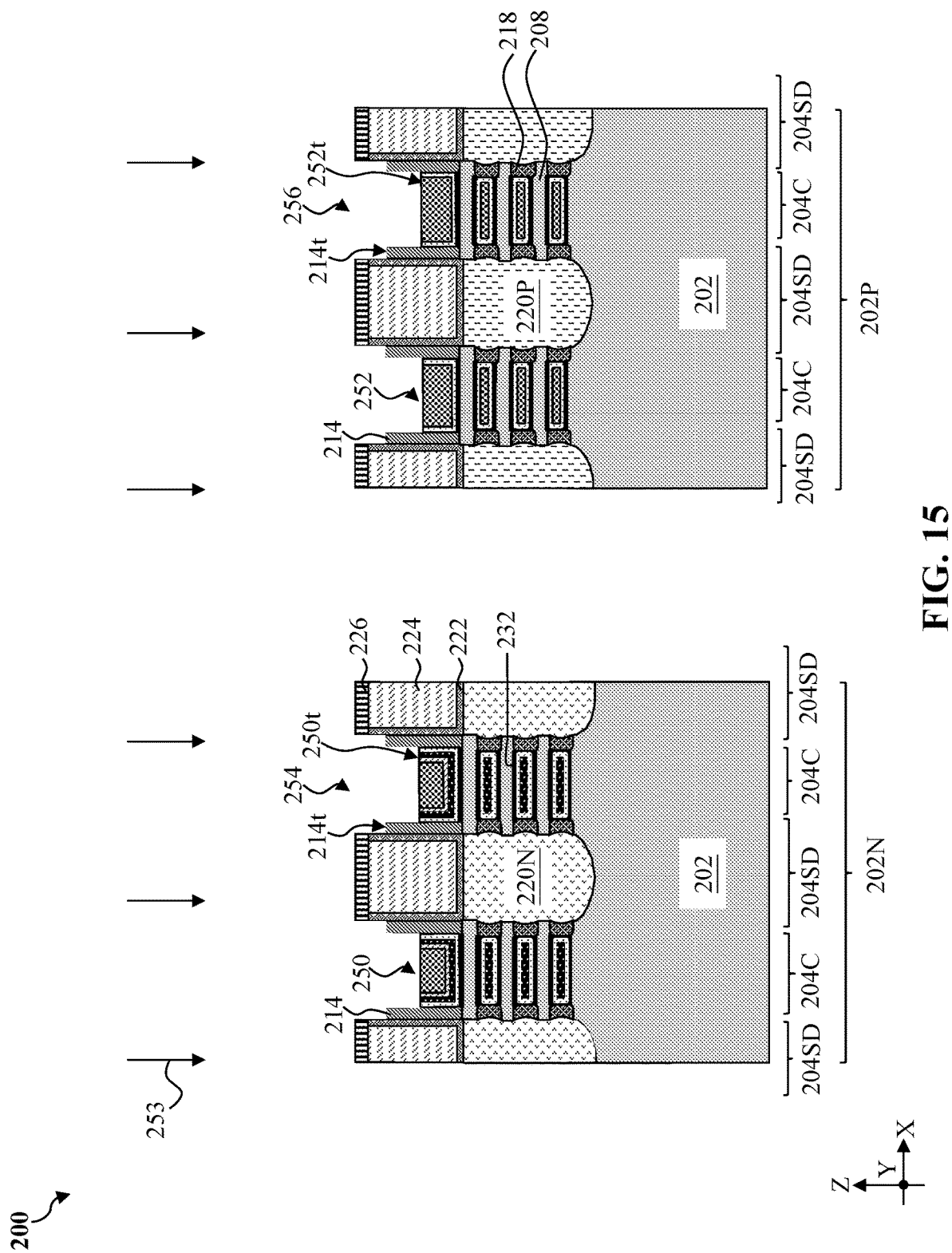

Referring to FIGS. 1 and 15, method 100 includes a block 126 where an etching process 253 is performed to recess the first gate structure 250 and the second gate structure 252 to form a gate recess 254 over the first region 202N and a gate recess 256 over the second region 202P, respectively, without substantially damaging the hard mask layer 226. In some embodiments, the etching process 253 may include a dry etching process, a wet etching process, or a combination thereof. For example, $N_2$, $NF_3$, $O_2$, $BCl_3$, $Cl_2$, $O_2$, combinations thereof, and/or other suitable etchants may be employed by the etching process 253 to recess the first gate structure 250 and the second gate structure 252. As shown in FIG. 15, after etching, the recessed first gate structure 250 has a top surface 250t exposing the gate dielectric layer 234, the n-type work function layer 236, the dielectric capping layer 238, and the p-type work function layer 244. The recessed second gate structure 252 has a top surface 252t exposing the gate dielectric layer 234 and the p-type work function layer 244. The gate spacers 214 are also slightly etched by the etching process 253. A top surface 214t of the gate spacer 214 is higher than the top surface 250t and the top surface 252t such that the CESL 222 and the ILD layer 224 are spaced apart from the gate structures 250/252. Therefore, source/drain contacts (i.e., conductive features that would be electrically coupled to the source/drain features 220N/220P via a corresponding silicide layer) penetrating the CESL 222 and the ILD layer 224 would be electrically isolated from to-be-formed metal caps (e.g., metal caps 262 and 263 shown in FIG. 17) even if there is insufficient selectivity during the selective deposition process 260 of the metal caps, providing an improved device reliability. The gate recess 254 exposes the top surfaces 214t and 250t, the gate recess 256 exposes the top surfaces 214t and 252t. In some embodiments, the top surface 250t and the top surface 252t are substantially planar top surfaces.

Figure 16:
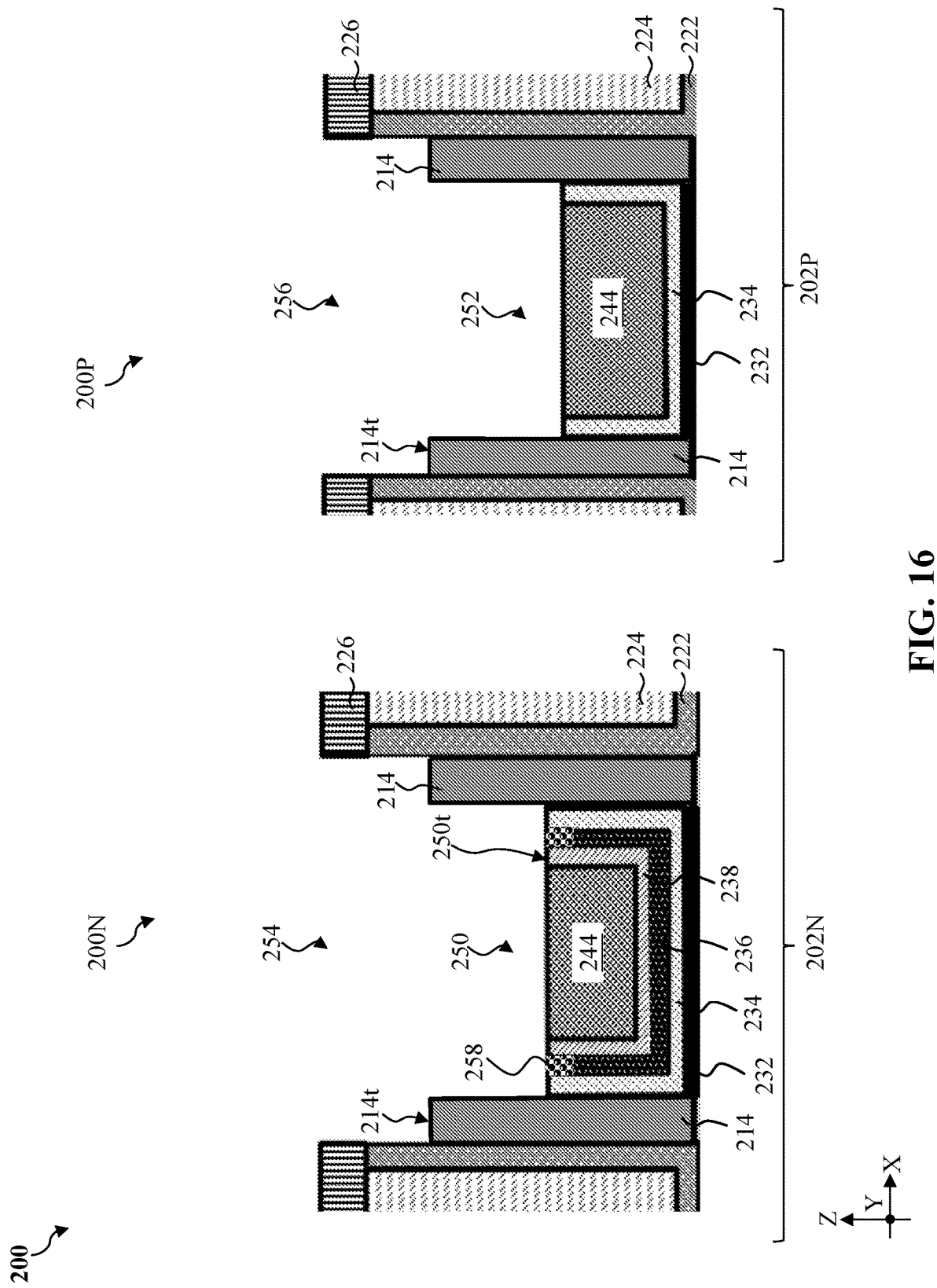

FIG. 16 depicts an enlarged portion of the recessed first gate structure 250 over the first region 202N and an enlarged portion of the recessed second gate structure 252 over the second region 202P. It is noted that, since the top surface 250t exposes the top surface of the n-type work function layer 236, a portion of the n-type work function layer 236 may be oxidized to form an oxide layer 258, as shown in FIG. 16. That is, the workpiece 200 may include an oxide layer 258 formed on the n-type work function layer 236. In embodiments where the n-type work function layer 236 includes titanium-aluminum based material, the oxide layer 258 includes aluminum oxide formed over the titanium-aluminum based n-type work function layer 236. The p-type work function layer 244 may not be substantially oxidized.

Figure 17:
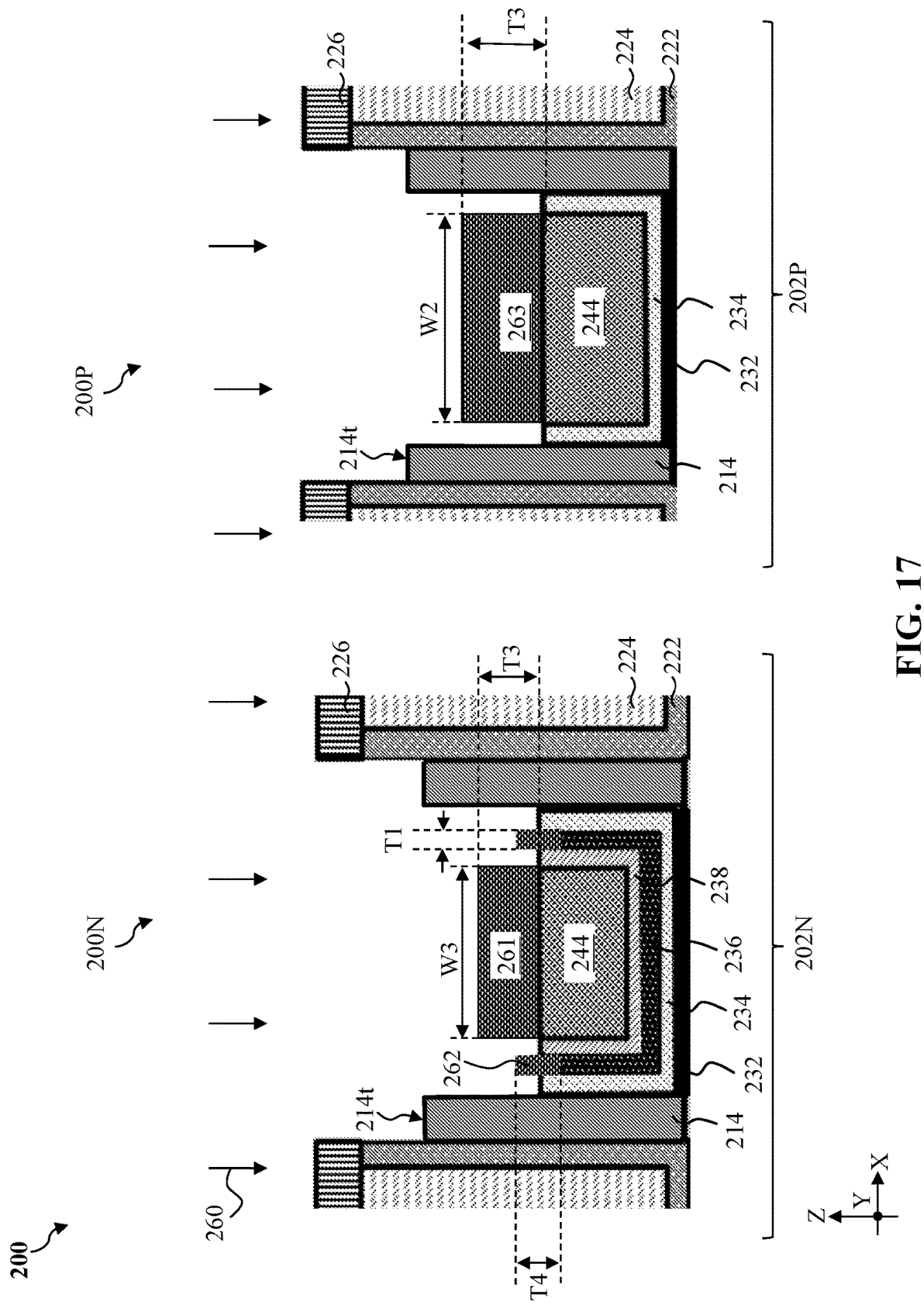

Referring to FIGS. 1 and 17, method 100 includes a block 128 where a selective deposition process 260 is performed to selectively form a first metal cap 261 on the p-type work function layer 244 over the first region 202N, a second metal cap 262 on the n-type work function layer 236 over the first region 202N, and a third metal cap 263 on the p-type work function layer 244 over the second region 202P. FIG. 17 depicts an enlarged portion of the workpiece 200 after the selective deposition process 260. In embodiments represented in FIG. 17, the first metal cap 261, the second metal cap 262, and the third metal cap 263 are formed by a common deposition process 260. In some embodiments, the first metal cap 261, the second metal cap 262, and the third metal cap 263 may include tungsten (W), cobalt (Co), nickel (Ni), molybdenum (Mo), ruthenium (Ru), or other suitable material. A resistivity of the material of the metal caps 261-263 is less than a resistivity of the p-type work function layer 244. The formation of the metal caps 261-263 may reduce the gate resistance and improve performance of the MBC transistors. In an exemplary embodiment, the selective deposition process 260 includes performing an ALD process 260 to selectively form the first metal cap 261, the second metal cap 262, and the third metal cap 263 over the workpiece 200 positioned within a process chamber. The ALD process 260 is a cyclic process. Each cycle includes a first half cycle and a second half cycle. Multiple cycles may be repeated until a satisfactory thickness T3 of the metal caps 261 and 263 on the p-type work function layer 244 is obtained.

Taking the formation of tungsten-based metal caps 261-263 as one example. The workpiece 200 shown in FIGS. 15-16 is loaded into a process chamber, where the process chamber is prepared for the ALD process 260 to form the tungsten-based metal caps 261-263 on the recessed first gate structure 250 and the recessed second gate structure 252. In the first half cycle, the workpiece 200 is exposed to a tungsten-containing precursor. The tungsten-containing precursor is selected such that it may be selectively deposited on the top surfaces of n-type work function layer 236 and the p-type work function layer 244. In an embodiment, the tungsten-containing precursor includes tungsten chlorides ($WCl_5$). It is noted that, since the n-type work function layer 236 is covered by the oxide layer 258, in first several cycles of the ALD process 260, the tungsten-containing precursor would not be deposited over the n-type work function layer 236 until the oxide layer 258 is removed. A carrier gas may be used to deliver the tungsten-containing precursor to the process chamber. In some embodiments, the carrier gas may be an inert gas, such as an argon-containing gas or other suitable inert gas, or combinations thereof. In some embodiments, before being transported to the process chamber, the tungsten chlorides ($WCl_5$) may be heated to arrive a temperature between about 100° C. and 150° C. After the first half cycle, a first purge process is performed to remove any remaining tungsten-containing precursor and any byproducts from the process chamber to prepare the surface of the workpiece 200 for the subsequent second half cycle.

In the second half cycle, a co-reactant is transported to the process chamber and the workpiece 200 is exposed to the co-reactant. In an embodiment, the co-reactant includes hydrogen (H$_2$). A carrier gas may be used to deliver the co-reactant to the process chamber. The co-reactant reacts with the tungsten-containing precursor deposited on the p-type work function layer 244 in the first half cycle. The reaction between the tungsten-containing precursor and the co-reactant selectively forms the tungsten-based metal caps 261 and 263 on the p-type work function layer 244 and generates byproducts. In embodiment where the tungsten-containing precursor includes tungsten chlorides (WCl$_5$) and the co-reactant includes hydrogen (H$_2$), the reaction between the tungsten-containing precursor and the co-reactant may selectively form tungsten (W) on the p-type work function layer 244 and generate byproducts including hydrogen chloride (HCl). Remarkably, the byproduct hydrogen chloride would react with the oxide layer 258 (i.e., Al$_2$O$_3$) formed on the n-type work function layer 236. That is, while forming the first tungsten-based metal cap 261 and the third tungsten-based metal cap 263 on the respective p-type work function layer 244, a byproduct of the ALD process 260 reacts with the oxide layer 258 on the n-type work function layer 236 and thus removes the oxide layer 258 to expose the top surface of the n-type work function layer 236. After the second half cycle, a second purge process may be performed to remove any remaining co-reactant and any byproducts from the process chamber. During the performing of the ALD process 260, a temperature maintained in the process chamber may be between about 400° C. and 500° C. and a pressure maintained in the process chamber may be about 10 torr to about 50 torr to provide a suitable deposition environment while facilitating the chemical reactions described above.

It is noted that, after removing the oxide layer 258 and exposing the top surface of the n-type work function layer 236, the ALD process 260 may start forming the second metal cap 262 on the top surfaces of the n-type work function layer 236. The ALD process 260 selectively forms the first metal cap 261, the second metal cap 262, and the third metal cap 263 without forming a metal cap on the dielectric capping layer 238 or the gate dielectric layer 234. Put differently, the metal cap formed over the top surface 250t of the recessed first gate structure 250 is discontinuous. In other words, the first metal cap 261 is spaced apart from the second metal cap 262. Since the ALD process 260 does not form the second metal cap 262 on the n-type work function layer 236 in the first several cycles due to the removal of the oxide layer 258, a thickness T4 (shown in FIG. 17) of the second metal cap 262 on the n-type work function layer 236 is smaller than the thickness T3 (shown in FIG. 17) of the first metal cap 261. In an embodiment, a ratio of the thickness T4 to the thickness T3 (i.e., T4/T3) may be between about 0.5 and about 1 to form the satisfactory p-type work function layer 244. In some embodiments, T3 is between about 1 nm and about 6 nm such that the methods for forming the final structure of the workpiece 200 may be readily integrated into existing semiconductor fabrication processes.

Still referring to FIG. 17, the first metal cap 261 substantially covers the top surface of the p-type work function layer 244 exposed by the gate recess 254 and the width of the first metal cap 261 along the X direction may be substantially equal to the width W3 (previously shown in FIG. 13). The second metal cap 262 substantially covers a top surface of the n-type work function layer 236 exposed by the gate recess 254 and the width of the second metal cap 262 may be substantially equal to the deposition thickness T1 in the cross-sectional view of the workpiece 200. Forming the second metal cap 262 on n-type work function layer 236 may prevent the n-type work function layer 236 from being further oxidized. A top view of the second metal cap 262 may resemble a disc shape or a donut shape. In some embodiments, a ratio of the width W3 to the thickness T1 may be between about 1 and about 5 to facilitate a satisfactory gate contact via landing on the first metal cap 261. In some embodiments, due to the removal of the oxide layer 258, a bottom surface of the second metal cap 262 may be lower than a bottom surface of the first metal cap 261. The third metal cap 263 substantially covers a top surface of the p-type work function layer 244 exposed by the gate recess 256 and the width of the third metal cap 263 may be substantially equal to W2 (previously shown in FIG. 13). The thickness of the third metal cap 263 substantially equals the thickness T3 of the first metal cap 261. In embodiments where metal caps 261-263 include other materials, the precursor and/or the co-reactant may be adjusted accordingly. For example, when the metal caps 261-263 include molybdenum (Mo), the precursor used in the first half cycle may include molybdenum chloride.

Figure 18:
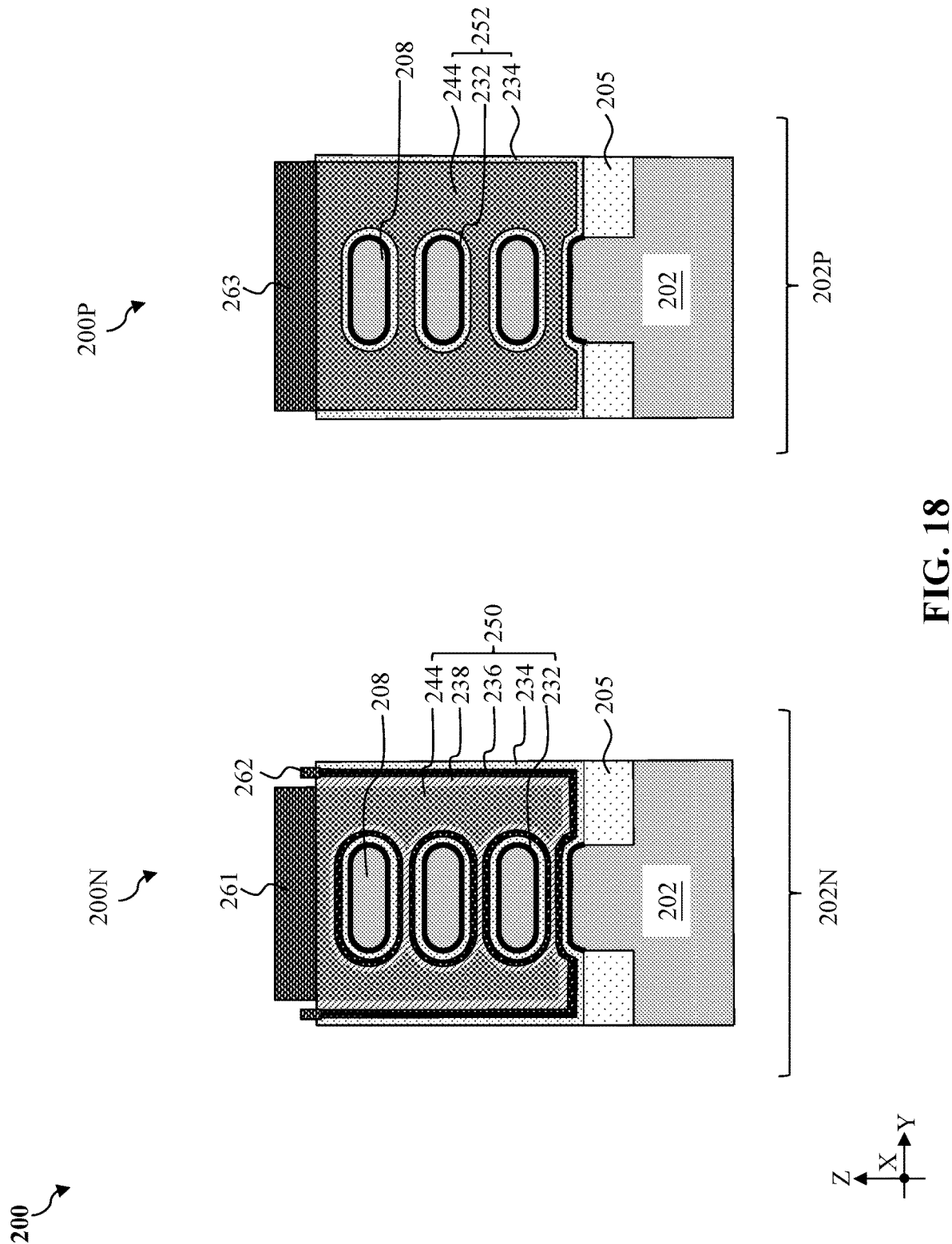

FIG. 18 depicts a cross-sectional view of the workpiece 200 shown in FIG. 17 when viewed from the X direction. The first gate structure 250 formed in the gate trench 228 includes the interfacial layer 232, the gate dielectric layer 234, the n-type work function layer 236, the dielectric capping layer 238, the p-type work function layer 244. It is noted that, the dielectric capping layer 238 may merge between adjacent channel members 208 over the first region 202N, preventing the p-type work function layer 244 and the metal caps 261-262 from entering openings 230 between adjacent channel members 208. The second gate structure 252 formed in the gate trench 229 includes the interfacial layer 232, the gate dielectric layer 234 and the p-type work function layer 244. It is noted that, the p-type work function layer 244 may merge between adjacent channel members 208 over the second region 202P, preventing the metal cap 263 from entering openings 231 between adjacent channel members 208.

Figure 19:
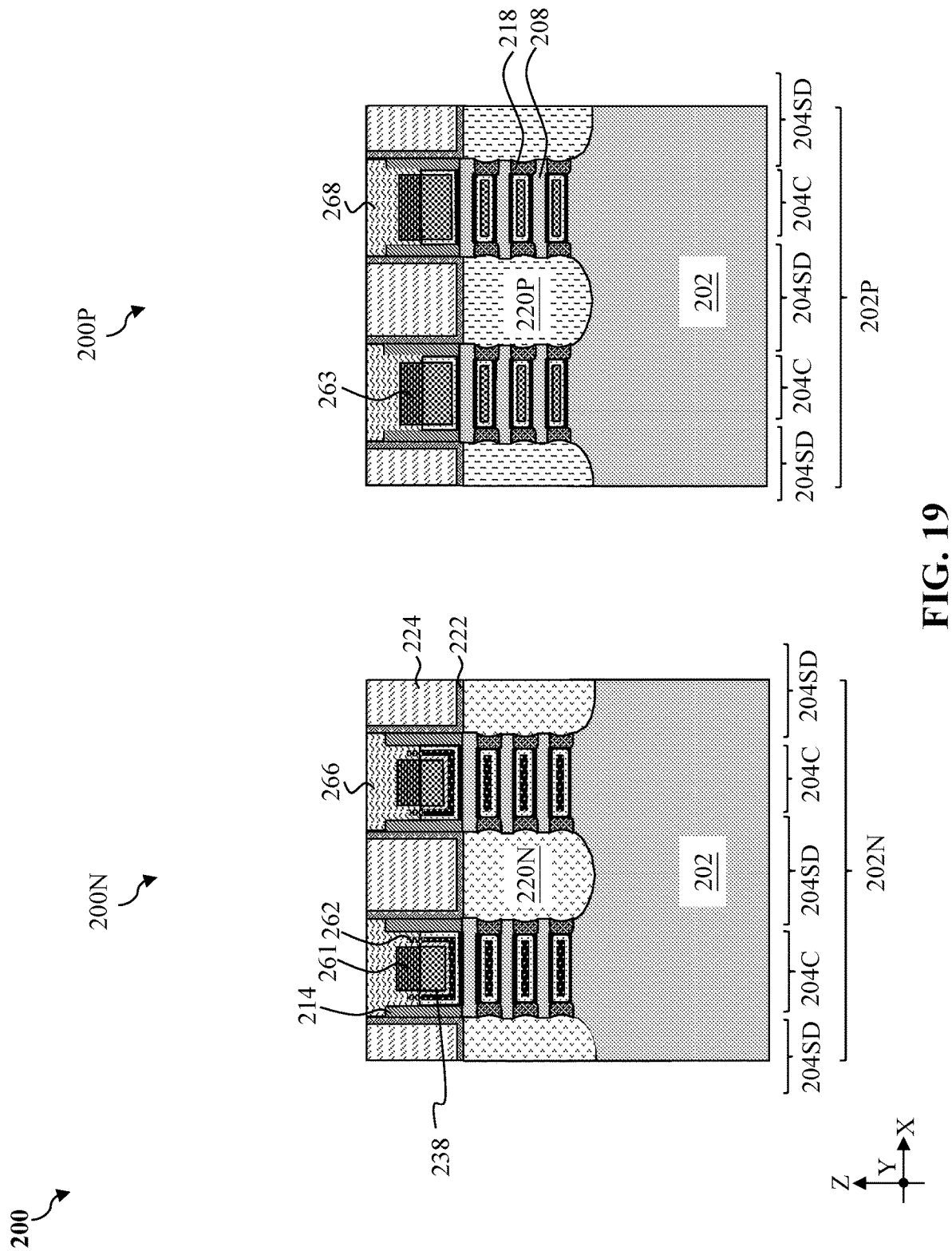

Referring to FIGS. 1 and 19, method 100 includes a block 130 where a first self-aligned cap (SAC) dielectric layer 266 is formed over the recessed first gate structure 250 and the gate spacers 214 to substantially fill the gate recess 254, and a second SAC dielectric layer 268 is formed over the recessed second gate structure 252 and the gate spacers 214 to substantially fill the gate recess 256. In an embodiment, a dielectric material layer is deposited over the workpiece 200 and a planarization process may be followed to remove excess dielectric material layer and the hard mask layer 226 to form the first SAC dielectric layer 266 and the second SAC dielectric layer 268. The dielectric material layer may be formed of hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. In an embodiment, the dielectric material layer is formed of silicon nitride. As shown in FIG. 19, the first metal cap 261 is spaced apart from the second metal cap 262 by a portion of the first SAC dielectric layer 266. The portion of the first SAC dielectric layer 266 may be in direct contact with the dielectric capping layer 238.

Referring to FIGS. 1 and 20, method 100 includes a block 132 where further processes are performed. Such further processes may include forming device-level contacts, such as the source/drain contacts (not shown) formed over the source/drain features and gate contact vias (e.g., gate contact vias 281 and 282) formed over the gate structures (e.g., gate structures 250 and 252). In embodiments shown in FIG. 20, the gate contact via 281 lands on the first metal cap 261 without landing on the second metal cap 262, and the gate contact via 282 lands on the third metal cap 263. By selectively forming the metal caps 261-262 on the n-type work function layer 236 and p-type work function layer 244, a gate resistance of the n-type MBC transistor 200N may be advantageously reduced by about 80%, comparing to a gate resistance of an n-type MBC transistor that doesn't have the selectively formed metal caps 261-262. Such further processes may also include forming a multi-layer interconnect (MLI) structure (not depicted) over the workpiece 200. The MLI may include various interconnect features, such as vias and conductive lines, disposed in dielectric layers, such as etch-stop layers and ILD layers (such as ILD layer 270). In some embodiments, the vias are vertical interconnect features configured to interconnect the device-level contacts.

In embodiments described above, after the etching process 253 described with reference to FIG. 15, the top surface 250t of the recessed first gate structure 250 and the top surface 252t of the recessed second gate structure 252 are substantially planar. In some situations, the etching process 253 employed in block 126 may etch the p-type work function layer 244 to a deeper position than other layers in the gate structures 250 and 252. In embodiments represented in FIG. 21, after the etching process 253, the p-type work function layers 244 formed over the first region 202N includes a concave top surface 244t1 and the p-type work function layers 244 formed over the second region 202P includes a concave top surface 244t2. In some embodiments, the lowest point of the top surface 244t2 is lower than the lowest point of the top surface 244t1. In some implementations, although portions of the n-type work function layer 236 are oxidized to form an oxide layer 258 on the n-type work function layer 236, a top surface of the unoxidized n-type work function layer 236 may be higher than the lowest point of the top surface 244t1 and the lowest point of the top surface 244t2.

Figure 21:
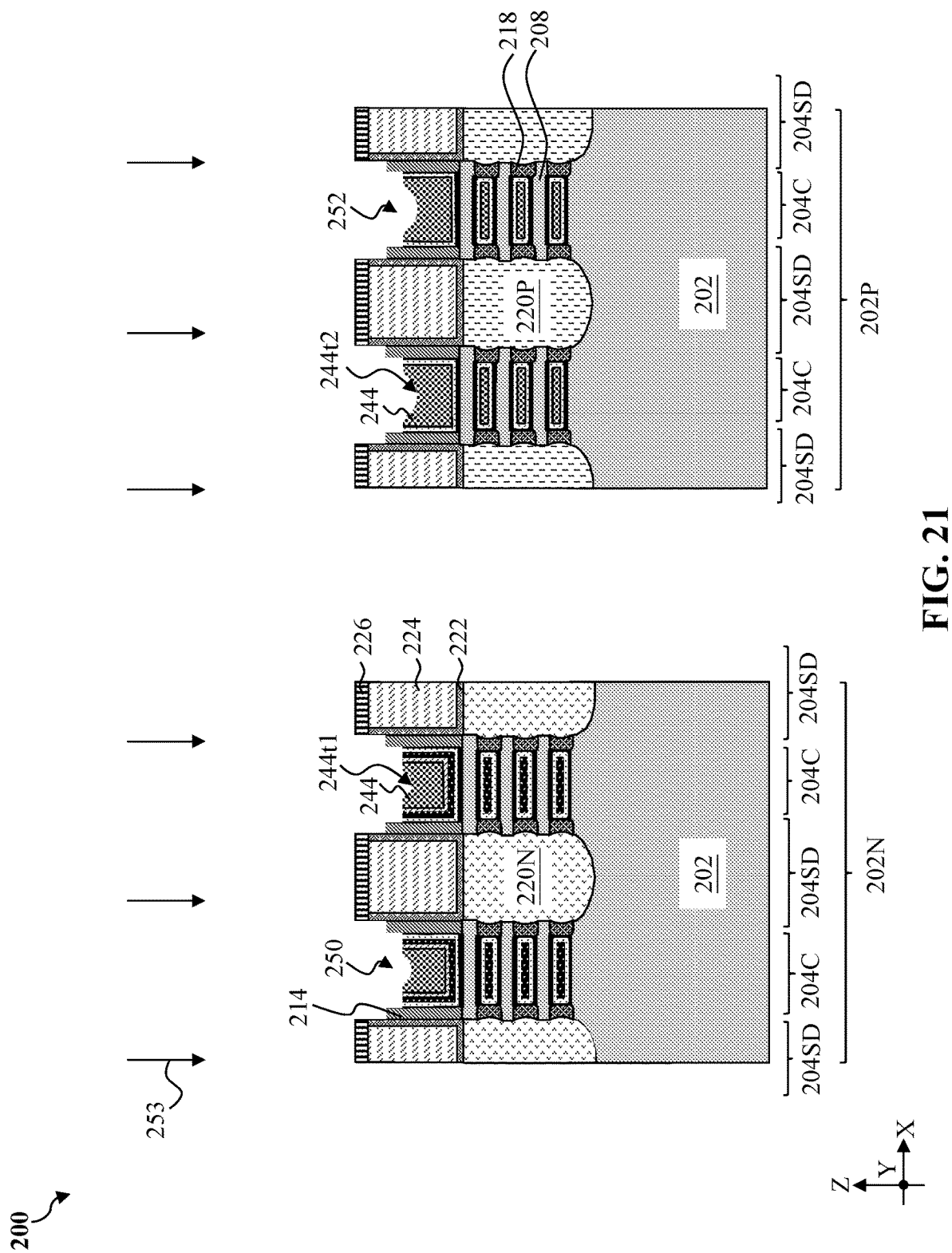
Figure 22:
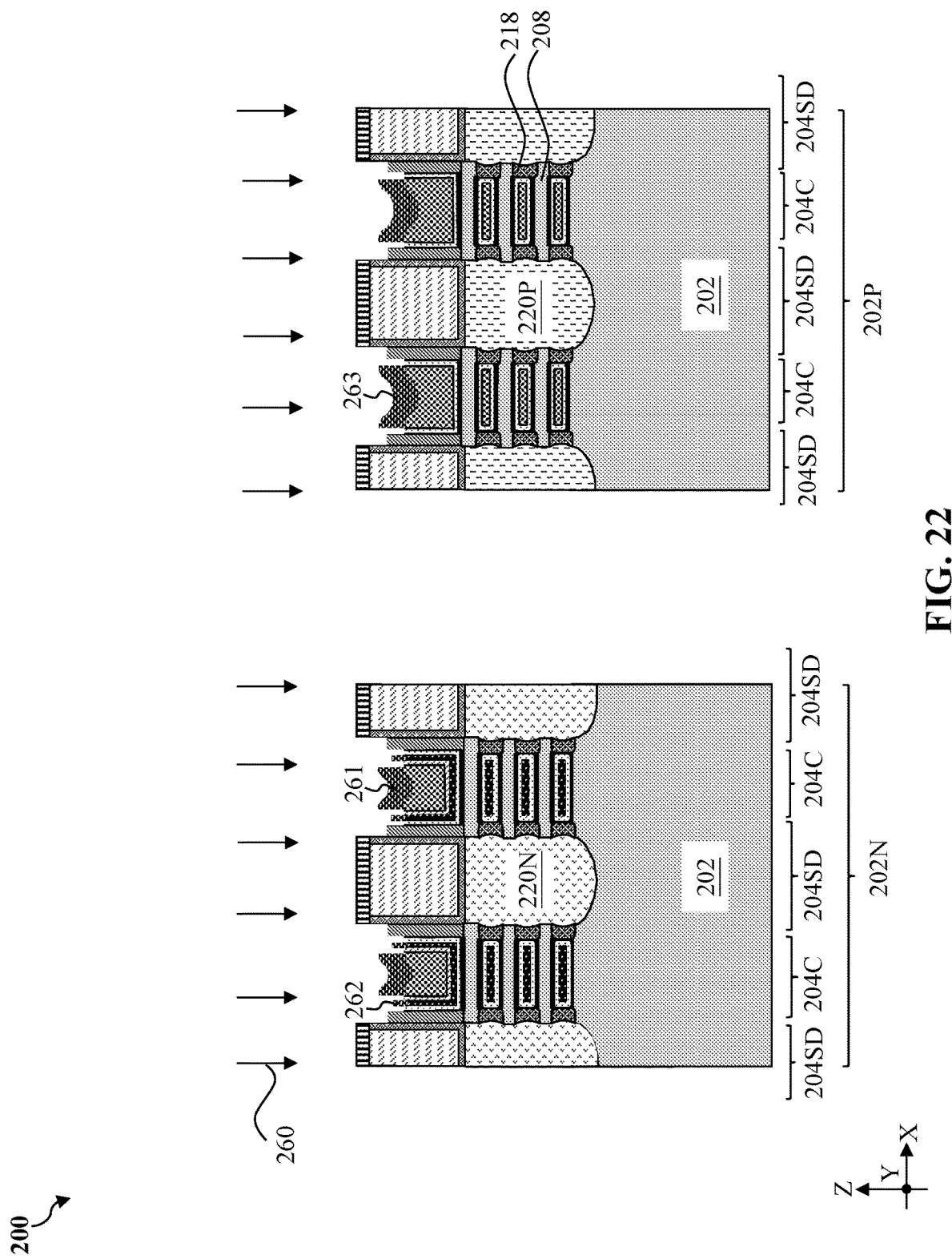

Operations in block 128 are then applied to the workpiece 200 shown in FIG. 21 as described above with reference to FIGS. 15-17. Referring to FIG. 22, A bottom surface of the first metal cap 261 tracks the shape of the top surface 244t1, a bottom surface of the third metal cap 263 tracks the shape of the top surface 244t2. In embodiments represented in FIG. 22, the bottom surface of the first metal cap 261 is lower than a bottom surface of the second metal cap 262, and the bottom surface of the third metal cap 263 is lower than the bottom surface of the first metal cap 261. The top surfaces of the first metal cap 261 and third metal cap 263 are also concave. The concavities of the top surfaces of the first metal cap 261 and third metal cap 263 may be same as the corresponding concavities of the bottom surfaces of the first metal cap 261 and third metal cap 263, respectively, due to the ALD process 260. Operations in block 130 and 132 of method 100 described with reference to FIGS. 19-20 may be then performed to finish the fabrication of the transistors 200N and 200P.

Although not intended to be limiting, one or more embodiments of the present disclosure provide many benefits to a semiconductor structure and the formation thereof. For example, the present disclosure provides a semiconductor structure including a first metal cap selectively formed on a p-type work function layer and a second metal cap selectively formed on an n-type work function layer, and methods of forming the same. In the present embodiments, the formation of the selectively formed metal caps allows reduction of the gate resistance of the semiconductor structure, especially the n-type transistors, thereby improving the overall performance of the semiconductor structure.

The present disclosure provides for many different embodiments. Semiconductor structures and methods of fabrication thereof are disclosed herein. In one exemplary aspect, the present disclosure is directed to a semiconductor device. The semiconductor device includes an active region, a gate structure directly over the active region and including a p-type work function layer, a dielectric capping layer extending along a sidewall surface and a bottom surface of the p-type work function layer, an n-type work function layer extending along a sidewall surface and a bottom surface of the dielectric capping layer, and a gate dielectric layer spaced apart from the dielectric capping layer by the n-type work function layer. A top surface of the gate structure includes a top surface of the n-type work function layer, a top surface of the dielectric capping layer and a top surface of the p-type work function layer. The semiconductor device also includes a conductive cap layer including a first portion disposed on the top surface of the n-type work function layer and a second portion disposed on the top surface of the p-type work function layer, the first portion being spaced apart from the second portion.

In some embodiments, the n-type work function layer may include titanium and aluminum. In some embodiments, the n-type work function layer may also include carbon. In some embodiments, the dielectric capping layer may include titanium, silicon, and oxygen. In some embodiments, the conductive cap layer may include tungsten or molybdenum. In some embodiments, a thickness of the first portion may be smaller than a thickness of the second portion. In some embodiments, a width of the first portion may be smaller than a thickness of the second portion. In some embodiments, the semiconductor device may also include a dielectric protection layer over the conductive cap layer, the first portion may be spaced apart from the second portion by a portion of the dielectric protection layer. In some embodiments, the semiconductor device may also include a contact via extending through the dielectric protection layer and electrically coupled to the gate structure, the contact via may be in direct contact with the second portion of the conductive cap layer. In some embodiments, the semiconductor device may also include a gate spacer, a portion of the gate dielectric layer may extend along a sidewall surface of the gate spacer, and a top surface of the gate spacer may be higher than a top surface of the portion of the gate dielectric layer. In some embodiments, the active region may include a stack of nanostructures, the n-type work function layer and the gate dielectric layer may wrap around each nanostructure of the stack of nanostructures.

In another exemplary aspect, the present disclosure is directed to a semiconductor structure. The semiconductor structure includes an n-type transistor including a first stack of nanostructures and a first gate structure over the first stack of nanostructures. The first gate structure includes a gate dielectric layer, an n-type work function layer embedded in the gate dielectric layer, a dielectric capping layer embedded in the n-type work function layer, and a p-type work function layer embedded in the dielectric capping layer. A top surface of the first gate structure exposes a top surface of the gate dielectric layer, a top surface of the n-type work function layer, a top surface of the dielectric capping layer, and a top surface of the p-type work function layer. The semiconductor structure also includes a first conductive cap layer disposed on the p-type work function layer and a second conductive cap layer disposed on the p-type work function layer. A composition of the first conductive cap layer is same as a composition of the second conductive cap layer.

In some embodiments, the second conductive cap layer may be surrounded by and spaced apart from the first conductive cap layer. In some embodiments, the first conductive cap layer and the second conductive cap layer may be not disposed over the top surface of the dielectric capping layer. In some embodiments, the first conductive cap layer may be not disposed over the top surface of the gate dielectric layer. In some embodiments, the semiconductor device may also include a p-type transistor that includes a second stack of nanostructures, a second gate structure over the second stack of nanostructures. The second gate structure includes the gate dielectric layer and the p-type work function layer over the gate dielectric layer, and a third conductive cap layer on the p-type work function layer. The second gate structure may be free of the n-type work function layer and the dielectric capping layer, and a composition of the third conductive cap layer may be same as the composition of the second conductive cap layer, and a thickness of the third conductive cap layer may be substantially equal to a thickness of the second conductive cap layer. In some embodiments, a top surface of the third conductive cap layer may be concave.

In yet another exemplary aspect, the present disclosure is directed to a method. The method includes providing a workpiece including an active region and gate spacers defining a gate trench over the active region. The method also includes forming a gate structure in the gate trench. The forming of the gate structure includes conformally forming a gate dielectric layer over the workpiece, where the gate dielectric layer including a horizontal portion over the active region and a vertical portion extending along a sidewall surface of the gate spacers, conformally depositing an n-type work function layer over the gate dielectric layer, conformally depositing a dielectric capping layer on the n-type work function layer, depositing a p-type work function layer over the dielectric capping layer. The method also includes etching back the gate structure to expose a top surface of the n-type work function layer, a top surface of the dielectric capping layer, and a top surface of the p-type work function layer, and after the etching back, selectively depositing a conductive cap layer on the top surface of the n-type work function layer and on the top surface of the p-type work function layer without depositing the conductive cap layer on the top surface of the dielectric capping layer.

In some embodiments, the etching back of the gate structure may partially oxidize the n-type work function layer to form an oxide layer. In some embodiments, the selectively depositing of the conductive cap layer may include performing an atomic layer deposition (ALD) process, and a byproduct of the ALD process may remove the oxide layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit-line conductor and word line conductor, one can achieve different resistances for the conductors. However, other techniques to vary the resistances of the metal conductors may also be utilized as well.

What is claimed is:

1. A semiconductor device, comprising:
   an active region;
   a gate structure directly over the active region and comprising:
      a p-type work function layer,
      a dielectric capping layer extending along a sidewall surface and a bottom surface of the p-type work function layer,
      an n-type work function layer extending along a sidewall surface and a bottom surface of the dielectric capping layer, and
      a gate dielectric layer spaced apart from the dielectric capping layer by the n-type work function layer,
      wherein a top surface of the gate structure comprises a top surface of the n-type work function layer, a top surface of the dielectric capping layer, and a top surface of the p-type work function layer; and
   a conductive cap layer on the gate structure and comprising a first portion disposed on the top surface of the n-type work function layer and a second portion disposed on the top surface of the p-type work function layer, the first portion being spaced apart from the second portion.

2. The semiconductor device of claim 1, wherein the n-type work function layer comprises titanium and aluminum.

3. The semiconductor device of claim 2, wherein the n-type work function layer further comprises carbon.

4. The semiconductor device of claim 1, wherein the dielectric capping layer comprises titanium, silicon, and oxygen.

5. The semiconductor device of claim 1, wherein the conductive cap layer comprises tungsten or molybdenum.

6. The semiconductor device of claim 1, wherein a thickness of the first portion is smaller than a thickness of the second portion.

7. The semiconductor device of claim 1, wherein a width of the first portion is smaller than a thickness of the second portion.

8. The semiconductor device of claim 1, further comprising:
   a dielectric protection layer over the conductive cap layer,
   wherein the first portion is spaced apart from the second portion by a portion of the dielectric protection layer.

9. The semiconductor device of claim 8, further comprising:
   a contact via extending through the dielectric protection layer and electrically coupled to the gate structure,
   wherein the contact via is in direct contact with the second portion of the conductive cap layer.

10. The semiconductor device of claim 1, further comprising:
    a gate spacer,
    wherein a portion of the gate dielectric layer extends along a sidewall surface of the gate spacer, and
    wherein a top surface of the gate spacer is higher than a top surface of the portion of the gate dielectric layer.

11. The semiconductor device of claim 1,
    wherein the active region comprises a stack of nanostructures,
    wherein the n-type work function layer and the gate dielectric layer further wrap around each nanostructure of the stack of nanostructures.

12. A semiconductor structure, comprising:
an n-type transistor comprising:
  a first stack of nanostructures;
  a first gate structure over the first stack of nanostructures, the first gate structure comprising:
    a gate dielectric layer,
    an n-type work function layer embedded in the gate dielectric layer,
    a dielectric capping layer embedded in the n-type work function layer, and
    a p-type work function layer embedded in the dielectric capping layer,
  wherein a top surface of the first gate structure exposes a top surface of the gate dielectric layer, a top surface of the n-type work function layer, a top surface of the dielectric capping layer, and a top surface of the p-type work function layer;
  a first conductive cap layer disposed on the p-type work function layer; and
  a second conductive cap layer disposed on the p-type work function layer,
  wherein a composition of the first conductive cap layer is same as a composition of the second conductive cap layer.

13. The semiconductor structure of claim 12, wherein the second conductive cap layer is surrounded by and spaced apart from the first conductive cap layer.

14. The semiconductor structure of claim 12, wherein the first conductive cap layer and the second conductive cap layer are not disposed over the top surface of the dielectric capping layer.

15. The semiconductor structure of claim 12, wherein the first conductive cap layer is not disposed over the top surface of the gate dielectric layer.

16. The semiconductor structure of claim 12, further comprising:
  a p-type transistor comprising:
    a second stack of nanostructures;
    a second gate structure over the second stack of nanostructures and comprising:
      the gate dielectric layer,
      the p-type work function layer over the gate dielectric layer; and
      a third conductive cap layer on the p-type work function layer,
    wherein the second gate structure is free of the n-type work function layer and the dielectric capping layer, and
    wherein a composition of the third conductive cap layer is same as the composition of the second conductive cap layer, and
    wherein a thickness of the third conductive cap layer is substantially equal to a thickness of the second conductive cap layer.

17. The semiconductor structure of claim 16, wherein a top surface of the third conductive cap layer is concave.

18. A method, comprising:
providing a workpiece comprising:
  an active region, and
  gate spacers defining a gate trench over the active region;
forming a gate structure in the gate trench, the forming of the gate structure comprising:
  conformally forming a gate dielectric layer over the workpiece, the gate dielectric layer comprising a horizontal portion over the active region and a vertical portion extending along a sidewall surface of the gate spacers;
  conformally depositing an n-type work function layer over the gate dielectric layer;
  conformally depositing a dielectric capping layer on the n-type work function layer;
  depositing a p-type work function layer over the dielectric capping layer;
etching back the gate structure to expose a top surface of the n-type work function layer, a top surface of the dielectric capping layer, and a top surface of the p-type work function layer; and
after the etching back, selectively depositing a conductive cap layer on the top surface of the n-type work function layer and on the top surface of the p-type work function layer without depositing the conductive cap layer on the top surface of the dielectric capping layer.

19. The method of claim 18, wherein the etching back of the gate structure partially oxidizes the n-type work function layer to form an oxide layer.

20. The method of claim 19,
wherein the selectively depositing of the conductive cap layer comprises performing an atomic layer deposition (ALD) process,
wherein a byproduct of the ALD process removes the oxide layer.

* * * * *